United States Patent
Dorrance et al.

(10) Patent No.: US 11,205,749 B2
(45) Date of Patent: Dec. 21, 2021

(54) SPINTRONIC DEVICES, DUPLEXERS, TRANSCEIVERS AND TELECOMMUNICATION DEVICES

(71) Applicant: Intel Corporation, Santa Clara, CA (US)

(72) Inventors: Richard Dorrance, Portland, OR (US); Farhana Sheikh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/474,575

(22) PCT Filed: Mar. 23, 2017

(86) PCT No.: PCT/US2017/023694
§ 371 (c)(1),
(2) Date: Jun. 28, 2019

(87) PCT Pub. No.: WO2018/174877
PCT Pub. Date: Sep. 27, 2018

(65) Prior Publication Data
US 2020/0020850 A1 Jan. 16, 2020

(51) Int. Cl.
*H01L 43/02* (2006.01)
*H01L 43/08* (2006.01)
(Continued)

(52) U.S. Cl.
CPC ............ *H01L 43/08* (2013.01); *H01L 43/02* (2013.01); *H01L 43/10* (2013.01); *H01L 43/12* (2013.01); *H04L 5/14* (2013.01)

(58) Field of Classification Search
None
See application file for complete search history.

(56) References Cited

U.S. PATENT DOCUMENTS 9,704,977 B2 * 7/2017 Koh .................. H01L 29/66977
10,763,425 B1 * 9/2020 Katti .................. G11C 11/1659
(Continued)

FOREIGN PATENT DOCUMENTS

| JP | 2000332317 A | 11/2000 |
|---|---|---|
| JP | 2011222546 A | 11/2011 |
| WO | 2010100711 A1 | 9/2010 |

OTHER PUBLICATIONS

"Receiver with Integrated Magnetic-Free N-Path-Filter-Based Non-Reciprocal Circulator and Baseband Self-Interference Cancellation for Full-Duplex Wireless", ISSCC 2016, Feb. 2, 2016.
(Continued)

*Primary Examiner* — Jefferson A Evans
(74) *Attorney, Agent, or Firm* — 2SPL Patent Attorneys PartG mbB; Yong Beom Hwang

(57) ABSTRACT

A spintronic device includes a first ferromagnetic layer. The first ferromagnetic layer includes a first direction of magnetic polarization. Furthermore, the spintronic device includes a second ferromagnetic layer. The second ferromagnetic layer includes a second direction of magnetic polarization opposite to the first direction. Furthermore, the spintronic device includes a long spin lifetime layer. Furthermore, the spintronic device includes a first tunnel barrier layer disposed between the first ferromagnetic layer and the long spin lifetime layer. Furthermore, the spintronic device includes a second tunnel barrier layer disposed between the second ferromagnetic layer and the long spin lifetime layer.

19 Claims, 9 Drawing Sheets

(51) Int. Cl.
*H01L 43/12* (2006.01)
*H04L 5/14* (2006.01)
*H01L 43/10* (2006.01)

(56) References Cited

U.S. PATENT DOCUMENTS

| | | | |
|---|---|---|---|
| 10,871,529 B2* | 12/2020 | Katti | G01L 1/10 |
| 2004/0057162 A1* | 3/2004 | Gill | G11B 5/3903 |
| | | | 360/314 |
| 2006/0022220 A1 | 2/2006 | Inomata et al. | |
| 2007/0159270 A1 | 7/2007 | Sunwoo et al. | |
| 2008/0017843 A1* | 1/2008 | Kaushal | H01F 10/16 |
| | | | 257/14 |
| 2009/0096045 A1 | 4/2009 | Hayakawa et al. | |
| 2011/0079767 A1* | 4/2011 | Senes | B82Y 10/00 |
| | | | 257/13 |
| 2012/0038355 A1 | 2/2012 | Sasaki et al. | |
| 2015/0180685 A1 | 6/2015 | Noest et al. | |
| 2016/0284982 A1* | 9/2016 | Sasaki | H01L 29/66984 |
| 2017/0200486 A1* | 7/2017 | Qiu | G11C 11/161 |
| 2021/0066391 A1* | 3/2021 | Campiglio | G01R 33/098 |
| 2021/0135090 A1* | 5/2021 | Sun | H01L 43/02 |
| 2021/0166133 A1* | 6/2021 | Ronagh | G06N 3/08 |

OTHER PUBLICATIONS

"FDSOI to Get Embedded MRAM, Flash Options at 28nm", EE Times, Peter Clarke, Jul. 26, 2016.
"GF Debuts 7nm, Embedded MRAM", EE Times, Rick Merritt, Sep. 15, 2016.
"IBM, Samsung Put New Spin on MRAM", EE Times, R. Colin Johnson, Jul. 7, 2016.
"Room temperature manipulation of long lifetime spins in metallic-like carbon nanospheres", Nature Communications, Balint Nafradi et al, Jul. 18, 2016.
"TSMC Preps 10nm, Tunes 16nm", EE Times, Rick Merritt, Sep. 17, 2015.
"Ultrasensitive Nanoscale Magnetic-Field Sensors Based on Resonant Spin Filtering", Abhishek Sharma, Ashwin Tulapurkar, and Bhaskaran Muralidharan, IEEE Transactions on Electron Devices, vol. 63, No. 11, Nov. 2016.
"Influence of Impurity Spin Dynamics on Quantum Transport in Epitaxial Graphene"; Samuel Lara-Avila, Sergey Kubatkin, Oleksiy Kashuba, Joshua A. Folk, Silvia Lüscher, Rositza Yakimova, T. J. B. M. Janssen, Alexander Tzalenchuk, and Vladimir Fal'ko; Phys. Rev. Lett. 115, 106602—Published Sep. 3, 2015.
"Spin transport in two-dimensional materials and van der Waals heterostructures"; Saroj Prasad Dash, Chalmers University of Technology, Department of Microtechnology and Nanoscience, SE-41296, Göteborg, Sweden; 2016 IEEE 16th International Conference on Nanotechnology (IEEE-NANO).
"Spin and pseudospins in layered transition metal dichalcogenides", Xiaodong Xu,1, Wang Yao,2, Di Xiao3, & Tony F. Heinz4, Nature Physics vol. 10, pp. 343-350, Year published: (2014).
"Effects of Dephasing on Spin Lifetime in Ballistic Spin-Orbit Materials", Aron W. Cummings and Stephan Roche, Phys. Rev. Lett. 116, 086602—Published Feb. 23, 2016.
"Extremely long quasiparticle spin lifetimes in superconducting aluminium using MgO tunnel spin injectors", Hyunsoo Yang, See-Hun Yang, Saburo Takahashi, Sadamichi Maekawa & Stuart S. P. Parkin, Nature Materials vol. 9, pp. 586-593, Year: 2010.
"Emergence of the persistent spin helix in semiconductor quantum wells", Koralek et alterea, Nature 458, 610-613 (Apr. 2, 2009).
"Long spin lifetime and large barrier polarisation in single electron transport through a CoFe nanoparticle", Temple et altera, Scientific Reports vol. 6, Article No. 28296, Year: 2016.
"Rashba Spin—Orbit Coupling Enhanced Carrier Lifetime in CH3NH3PbI3", Zheng et altera, Nano Lett., 2015, 15 (12), pp. 7794-7800.
A. Fert et al.: "Semiconductors Between Spin-Polarized Sources and Drains", IEEE Transactions on Electron Devices, IEEE Service Center, Piscataway, NJ, US, vol. 54, No. 5, May 1, 2007, pp. 921-932, XP011179515.
Bai Chunxu et al.: "Specular Andreev reflection and magnetoresistance in graphene-based ferromagnet-superconductor hybrid systems", Journal of Physics: Condensed Matter, Institute of Physics Publishing, Bristol, GB, vol. 20, No. 33, Aug. 20, 2008, p. 335202, XP020143639, ISSN: 0953-8984, DOI: 10.1088/0953-8984/20/33/335202.

* cited by examiner

300-A

| TMR | P | PATH LOSS [dB] | | |
|---|---|---|---|---|
| | | (1) to (2) | (1) to (3) | (2) to (1)/(3) |
| 125% | 0.745 | 2.553 | 11.881 | 3.010 |
| 250% | 0.845 | 1.461 | 16.202 | 3.010 |
| 1,000% | 0.953 | 0.414 | 26.644 | 3.010 |
| 2,500% | 0.981 | 0.170 | 34.235 | 3.010 |

300-B

| TMR | INSERTION LOSS [dB] | ISOLATION [dB] |
|---|---|---|
| 125% | 2.553 | 8.871 |
| 250% | 1.461 | 13.192 |
| 1,000% | 0.414 | 23.634 |
| 2,500% | 0.170 | 31.225 |

500-D

| TMR | P | TMR_EFF | P_EFF | LOSS [dB] | | |
|---|---|---|---|---|---|---|
| | | | | (1) to (2) | (1) to (3) | (2) to (1)/(3) |
| 125% | 0.745 | 697% | 0.9352 | 0.582 | 23.763 | 3.010 |
| 250% | 0.845 | 2,011% | 0.9760 | 0.211 | 32.404 | 3.010 |
| 1,000% | 0.953 | 23,012% | 0.9978 | 0.019 | 53.288 | 3.010 |
| 2,500% | 0.981 | 132,512% | 0.9996 | 0.003 | 68.471 | 3.010 |

500-E

|  | MISMATCH | | |
|---|---|---|---|
|  | 0.00% | 1.00% | 5.00% |
| IN-BAND LOSS [dB] | 0.449 | 0.541 | 0.919 |
| OUT-OF-BAND LOSS [dB] | 27.550 | 25.692 | 20.731 |

500-F

| TMR | INSERTION LOSS [dB] | ISOLATION (IN-BAND) [dB] | ISOLATION (OUT-OF-BAND) [dB] |
|---|---|---|---|
| 125% | 1.031 | 21.201 | 48.303 |
| 250% | 0.660 | 29.843 | 56.944 |
| 1,000% | 0.468 | 50.726 | 77.828 |
| 2,500% | 0.452 | 65.909 | 93.011 |

500-G

| TMR | INSERTION LOSS [dB] | ISOLATION (IN-BAND) [dB] | ISOLATION (OUT-OF-BAND) [dB] |
|---|---|---|---|
| 125% | 1.170 | 20.648 | 45.800 |
| 250% | 0.796 | 28.289 | 53.441 |
| 1,000% | 0.603 | 40.425 | 65.577 |
| 2,500% | 0.588 | 42.919 | 68.071 |

500-H

| TMR | INSERTION LOSS [dB] | ISOLATION (IN-BAND) [dB] | ISOLATION (OUT-OF-BAND) [dB] |
|---|---|---|---|
| 125% | 1.736 | 18.839 | 38.651 |
| 250% | 1.355 | 24.108 | 43.921 |
| 1,000% | 1.158 | 29.228 | 49.041 |
| 2,500% | 1.142 | 29.819 | 49.632 |

SPINTRONIC DEVICES, DUPLEXERS, TRANSCEIVERS AND TELECOMMUNICATION DEVICES

FIELD

Examples relate to spintronic devices used in telecommunication, duplexer devices, transceiver devices, and telecommunication devices.

BACKGROUND

The ever increasing demand for higher data rates, larger bandwidth and faster electronic circuits keeps posing new challenges in the fields of telecommunication and electronics. For example, the arrival of the smart phone and the ability to go online almost anywhere on the planet have created the necessity to provide a rapidly growing amount of users with large volumes of data. Hence, there is a desire to provide improved concepts for telecommunication applications enabling higher data rates and operating more reliably. Such a demand may at least be partially satisfied by the subject matter of the present disclosure.

BRIEF DESCRIPTION OF THE FIGURES

Some examples of apparatuses and/or methods will be described in the following by way of example only, and with reference to the accompanying figures, in which

FIG. 5b shows a timing diagram of control voltages of the first, second, third, and fourth N-path filter of the duplexer device of FIG. 5a;

FIG. 5c summarizes the isolation between the transmit port and receive port of the duplexer device of FIG. 5a;

FIG. 5d shows a table displaying tunnel magnetic resistance versus effective path loss of a spintronic device in an enhanced spin-based circulator without mismatch;

FIG. 6b shows a timing diagram of the control voltages of the transistors of the N-path filters of the duplexer device of FIG. 6a;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
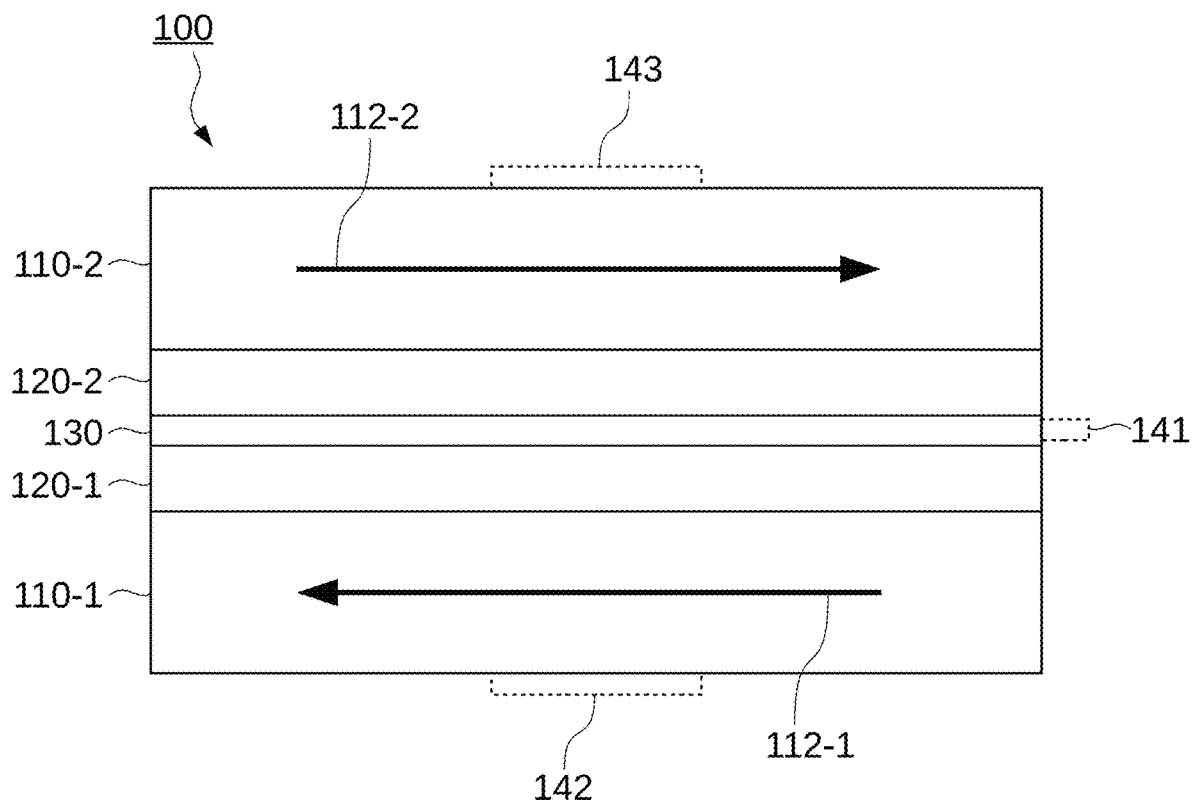
FIG. 1 shows a schematic diagram of a spintronic device.

FIG. 1 shows a schematic diagram of a spintronic device 100. The spintronic device 100 comprises a first ferromagnetic layer 110-1. The first ferromagnetic layer 110-1 comprises a first direction of magnetic polarization 112-1. Furthermore, the spintronic device 100 comprises a second ferromagnetic layer 110-2. The second ferromagnetic layer 110-2 comprises a second direction of magnetic polarization 112-2 opposite to the first direction 112-1. Furthermore, the spintronic device 100 comprises a long spin lifetime layer 130. Furthermore, the spintronic device 100 comprises a first tunnel barrier layer 120-1 disposed between the first ferromagnetic layer 110-1 and the long spin lifetime layer 130. Furthermore, the spintronic device 100 comprises a second tunnel barrier layer 120-2 disposed between the second ferromagnetic layer 110-2 and the long spin lifetime layer 130.

By providing a spintronic device in the described manner, an electric current flowing (e.g., tunneling) from the first ferromagnetic layer 110-1 through the first tunnel barrier layer 120-1 into the long spin lifetime layer 130 can be spin polarized in the first direction of magnetic polarization 112-1. This spin polarized current entering the long spin lifetime layer 130 can then be blocked from flowing (e.g., tunneling) into the second ferromagnetic layer 110-2 due to the second direction of magnetic polarization 112-2 being opposite to the direction of spin polarization of the current. Analogously, an electric current flowing (e.g., tunneling) from the second ferromagnetic layer 110-2 through the second tunnel barrier layer 120-2 into the long spin lifetime layer 130 can be spin polarized in the second direction of magnetic polarization 112-2, enter the long spin lifetime layer 130, but be blocked from flowing (e.g., tunneling) into the first ferromagnetic layer 110-1. Moreover, an unpolarized current can flow from the long spin lifetime layer 130 to the second ferromagnetic layer 110-2 (and/or to the first ferromagnetic layer 110-1). Due to these properties, the spintronic device 100 can be used as a non-reciprocal electronic device and for controlling the direction of flow of currents and/or signals associated with these currents. For example, the spintronic device 100 can be used for replacing a circulator within a radio frequency (RF) circuit.

Circulators can be passive non-reciprocal three- or four-port devices, in which an RF signal entering any port can be transmitted to the next port in rotation only. In a three-port device, a signal applied to port 1 can only output from port 2; a signal applied to port 2 can output only from port 3; a signal applied to port 3 can only output from port 1. Circulators can be used for full-duplex communication, where signals from the transmitter to the antenna and from the antenna to the receiver can be isolated (e.g., separated) from each other such that both transmitting and receiving can occur simultaneously using the same frequency and antenna. Full-duplex communication can theoretically double throughput (e.g., of data) if receive and transmit signals can be sufficiently isolated so that each does not interfere with the other. However, circulators can be expensive to build, bulky, and difficult to integrate on-chip as they are often built from either ferrite materials which can be bulky in nature and can have narrow bandwidths, or can be built from non-ferrite materials which can be active in nature and non-reciprocal. Non-ferrite circulators can have severe power limitations and large signal-to-noise degradation which cannot effectively support full-duplex communication. In contrast, the spintronic device 100 can be a compact solution that can be integrated with CMOS circuits resulting in an on-chip circulator solution. Hence, the proposed spintronic device 100 can enable full-duplex communication of transceiver and/or telecommunication devices leading to an increase (e.g., doubling) of data throughput.

The first direction of magnetic polarization 112-1 of the first ferromagnetic layer 110-1 and the second direction of magnetic polarization 112-2 of the second ferromagnetic layer 110-2 can be independent of external magnetic fields. This can make the operation of the spintronic device 100 more reliable. In other words, the first and the second direction of magnetic polarization 112-1, 112-2 can be permanent.

To this end, the first ferromagnetic layer 110-1 can be adjacent to a first antiferromagnetic pinning layer of the spintronic device 100 (e.g., the first ferromagnetic layer 110-1 can be located between the first antiferromagnetic pinning layer and the first tunnel barrier layer 120-1). Contact (and/or proximity) between the first antiferromagnetic pinning layer and the first ferromagnetic layer 110-1 can provoke an effect known as exchange bias effect, causing the magnetization of the first ferromagnetic layer 110-1 to align in the first direction of magnetic polarization 112-1. The second ferromagnetic layer 110-2 can be adjacent to a second antiferromagnetic pinning layer of the spintronic device 100 (e.g., the second ferromagnetic layer 110-2 can be located between the second antiferromagnetic pinning layer and the second tunnel barrier layer 120-2). Contact (and/or proximity) between the second antiferromagnetic pinning layer and the second ferromagnetic layer 110-2 can then cause the magnetization of the second ferromagnetic layer 110-2 to align in the second direction of magnetic polarization 112-2 which is opposite (e.g., antiparallel) to the first direction of magnetic polarization 112-1. The first and/or the second antiferromagnetic pinning layer can comprise iridium, manganese, platinum, or alloys comprising these, for example.

The first ferromagnetic layer 110-1 can be configured to spin polarize a first electric current passing through the first ferromagnetic layer 110-1 in the first direction of magnetic polarization 112-1. The second ferromagnetic layer 110-2 can be configured to spin polarize a second electric current passing through the second ferromagnetic layer 110-2 in the second direction of magnetic polarization 112-2. In this context, spin polarizing an electric current means that when an unpolarized electric current enters the first or the second ferromagnetic layer 110-1, 110-2 at least 70% of the current leaving the first or the second ferromagnetic layer 110-1, 110-2, respectively, will be spin polarized. In other words, the magnetic dipole moments of the electrons of an unpolarized current entering the first or the second ferromagnetic layer 110-1, 110-2 do not have any preferred direction. However, when these electrons leave the first or the second ferromagnetic layer 110-1, 110-2, respectively, the magnetic dipole moments of at least 70% of the electrons will be aligned in the same direction (e.g., in the first or the second direction of the magnetic polarization 112-1, 112-2, respectively). The percentage of electrons having aligned magnetic dipole moments depends on the strength of the magnetic field of the first and the second ferromagnetic layer 110-1, 110-2. A stronger magnetic field can align the magnetic dipole moments of a larger percentage of electrons.

For example, the first electric current can tunnel from the first ferromagnetic layer 110-1 through the first tunnel barrier layer 120-1 to the long spin lifetime layer 130. The long spin lifetime layer 130 can be configured to retain (or at least to partially retain) the spin polarity of any current injected into it. The second ferromagnetic layer 110-2 can then act as a spin filter towards the first electric current. Because the first electric current is polarized in the first direction of magnetic polarization 112-1 that is opposite to the second direction of magnetic polarization 112-2 of the second ferromagnetic layer 110-2, the second ferromagnetic layer 110-2 can block the first electric current from tunneling through the second tunnel barrier layer 120-2 and from being injected into the second ferromagnetic layer 110-2. Similarly, the first ferromagnetic layer 110-1 can block the second electric current coming from the second ferromagnetic layer 110-2 from tunneling through the first tunnel barrier layer 120-1 and from being injected into the first ferromagnetic layer 110-1.

The directions of spin polarization (e.g., executed by the first and second ferromagnetic layer 110-1, 110-2) can be independent of the operating state of the spintronic device 100. For example, the spintronic device 100 can be a passive device having only one operating state, in which the first and the second direction of magnetic polarization 112-1, 112-2 are fixed in opposite directions and are permanent. The exemplary passive spintronic device 100 does not require any electric power and does therefore not increase the power consumption of a duplexer, transceiver and/or telecommunication device it is used in.

The spintronic device 100 can further comprise an electrode structure 141 (e.g., a first electrode structure) coupled to (e.g., connected to) the long spin lifetime layer 130. For example, the first electric current injected from the first ferromagnetic layer 110-1 into the long spin lifetime layer 130 may flow off the electrode structure 141 connected to the long spin lifetime layer 130. A current being injected from the electrode structure 141 into the long spin lifetime layer 130 may be unpolarized (e.g., not spin polarized). A first share of this current having a spin polarization parallel to the first direction of magnetic polarization 112-1 may tunnel through the first tunnel barrier layer 120-1 and be injected into the first ferromagnetic layer 110-1, whereas a second share of this current having a spin polarization parallel to the second direction of magnetic polarization 112-2 may tunnel through the second tunnel barrier layer 120-2 and be injected into the second ferromagnetic layer 110-2.

Additionally, the spintronic device can further comprise a second electrode structure 142 coupled to the first ferromagnetic layer 110-1 and a third electrode structure 143 coupled to the second ferromagnetic layer 110-2. The second and the third electrode structure 142, 143 can provide means of electrically contacting the first and the second ferromagnetic layer 110-1, 110-2, respectively.

In an application of the spintronic device 100 within a transceiver device, the first electrode structure 141 can be connected to a transceive port of the transceiver device. The transceive port can be configured to transmit and receive signals. For example, the transceive port may comprise a waveguide port and/or an antenna. A transmit signal path of the transceiver device can be configured to provide transmit signals and can be connected to the second electrode structure 142. A receive signal path of the transceiver device can be configured to receive (e.g., demodulate) receive signals and can be connected to the third electrode structure 143. A transmit signal coming from the second electrode structure 142 can then be directed via the first ferromagnetic layer 110-1, the first tunnel barrier layer 120-1, the long spin lifetime layer 130, and the first electrode structure 141 to the transceive port and be prevented from penetrating the receive signal path due to the filter effect of the second ferromagnetic layer 110-2. A receive signal arriving from the transceive port via the first electrode structure 141 at the long spin lifetime layer 130 may be unpolarized. At least a share of the receive signal (e.g., a share of an electric current associated with the receive signal) having a spin polarization parallel to the second direction of magnetic polarization 112-2 can travel via the second tunnel barrier layer 120-2, the second ferromagnetic layer 110-2, and the third electrode structure 143 to the receive signal path, where it can undergo further analog and/or digital signal processing (e.g., demodulation).

The first, second, and/or third electrode structure 141, 142, 143 can comprise lateral wiring elements (e.g., transmission lines and/or conductive planes) and/or vertical wiring elements (e.g., vias). Materials of the first, second, and/or third electrode structure 141, 142, 143 can comprise metals such as copper, tungsten, silver, gold, iron, aluminum, and/or alloys of these, doped crystalline or polycrystalline semiconductor material (e.g., doped silicon and/or doped gallium arsenide), and/or metal-semiconductor alloys.

A tunnel magnetoresistance (TMR) between the second electrode structure 142 and the third electrode structure 143 can be larger than about 200% (or larger than 250%, or larger than 500%, or larger than 1000%, or larger than 2500%). The tunnel magnetoresistance TMR between the second electrode structure 142 and the third electrode structure 143 is defined as the difference between the electric resistance $R_{AP}$ of the spintronic device 100 (between the second and the third electrode structure) and the electric resistance $R_P$ (between a second and a third electrode structure) of a spintronic device that is identically constructed as the spintronic device 100 except that the magnetic polarizations of the first and the second ferromagnetic layers are parallel with respect to each other (e.g., have the same orientation) divided by the electric resistance $R_P$ of that spintronic device:

$$TMR = \frac{R_{AP} - R_P}{R_P}. \qquad \text{Equation 1}$$

One possibility to measure the tunnel magnetoresistance of the spintronic device 100 is to measure the electric resistance $R_{AP}$ of the spintronic device 100 between the second electrode structure 142 and the third electrode structure 143, to construct a spintronic device that is identically constructed as the spintronic device 100 but has the magnetic polarizations of the first and the second ferromagnetic layers oriented in parallel with respect to each other, and to measure the electric resistance $R_P$ of that spintronic device between its second and third electrode structure. When measuring the electric resistances $R_{AP}$ and $R_P$, in each case the first electrode structure is matched to the system impedance of the respective spintronic device. Afterwards the tunnel magnetoresistance of the spintronic device 100 can be determined from Equation 1.

A large tunnel magnetoresistance (e.g., larger than 200%) between the second electrode structure 142 and the third electrode structure 143 of the spintronic device 100 can provide a higher isolation between the second and the third electrode structure 142, 143. In an application of the spintronic device 100 as a duplexer, this can decrease an insertion loss from the transmit signal path to the transceive port and/or can provide a higher protection of the receive signal path against coupling of transmit signals into the receive signal path.

For example, the resistance between the second electrode structure 142 and the third electrode structure 143 can be larger than about 1.8 kOhm (or larger than about 5 kOhm, or larger than about 10 kOhm, or larger than about 100 kOhm). When measuring the resistance between the second and the third electrode structure 142, 143, the first electrode structure 141 is matched to the system impedance of the spintronic device 100. A large resistance (e.g., larger than 1.8 kOhm) between the second electrode structure 142 and the third electrode structure 143 of the spintronic device 100 can provide a higher isolation between the second and the third electrode structure 142, 143.

A resistance between the first electrode structure 141 and the second electrode structure 142 and a resistance between the first electrode structure 141 and the third electrode structure 143 can each be less than about 800 Ohm (or less than about 400 Ohm, or less than about 200 Ohm, or less than about 100 Ohm, or less than about 50 Ohm, or less than about 10 Ohm, or less than about 1 Ohm). When measuring the resistance between the first and the second electrode structure 141, 142, the third electrode structure 143 is matched to the system impedance of the spintronic device 100. When measuring the resistance between the first and the third electrode structure 141, 143, the second electrode structure 142 is matched to the system impedance of the spintronic device 100.

A lower resistance between the first and the second electrode structure 141, 142, can result in a lower insertion loss between the first and the second electrode structure 141, 142. Hence, in an application of the spintronic device 100 as a duplexer, a transmit signal propagating from the second to the first electrode structure can be less attenuated. Similarly, a lower resistance between the first and the third electrode structure 141, 143, can result in a lower insertion loss between the first and the third electrode structure 141, 143, so that a receive signal traveling from the first to the third electrode structure may undergo a lower attenuation. This can improve the noise figure of a transceiver device using the spintronic device 100 as a duplexer.

Furthermore, the resistance between the second electrode structure 142 and the third electrode structure 143 can be at least about 10 times larger (or at least about 50 times larger, or at least about 100 larger, or at least about 1000 times larger) than the resistance between the first electrode structure 141 and the second electrode structure 142 and can be at least about 10 times larger (or at least about 50 times larger, or at least about 100 larger, or at least about 1000 times larger) than the resistance between the first electrode structure 141 and the third electrode structure 143. In this way, a high isolation between the second and the third electrode structure can be achieved, while a high coupling (e.g., low insertion loss) between the second and the first electrode structure and between then first and the third electrode structure can be obtained. In turn, this can enable utilizing the spintronic device as a duplexer device or in a duplexer device.

The long spin lifetime layer 130 can comprise (e.g., be configured to exhibit) less than about 30% (or less than about 20%, or less than about 10%, or less than about 5%, or less than about 1%) spin coherence degradation of a spin polarized current flowing through the long spin lifetime layer. A low spin coherence degradation can provide a higher isolation (or higher resistance, or higher TMR) between the first ferromagnetic layer 110-1 (and/or the second electrode structure 142) and the second ferromagnetic layer 110-2 (and/or the third electrode structure 143). When the spin coherence degradation is low, a spin polarized current injected into the long spin lifetime layer 130 from the first ferromagnetic layer 110-1, for example, can keep its spin polarization to a large amount, such that it is prevented from entering the second ferromagnetic layer 110-2.

A spin coherence degradation of less than 30% exhibited by the long spin lifetime layer 130 can be understood in the following manner: When a 100% spin polarized current enters the long spin lifetime layer 130 (e.g., coming from the first ferromagnetic layer 110-1 and being spin polarized in the first direction 112-1 of magnetic polarization) at least still 70% of this current is still spin polarized (e.g., in the first direction 112-1 of magnetic polarization) when this current arrives at the interface of the long spin lifetime layer 130 with the second tunnel barrier layer 120-2 or when this current arrives at the interface of the long spin lifetime layer 130 with the first electrode structure 141.

In order to exhibit a spin coherence degradation of less than 30%, a thickness of the long spin lifetime layer 130 can be dimensioned sufficiently small enough. Additionally or alternatively, the long spin lifetime layer 130 can be constructed from materials retaining the spin polarity of a current injected into them.

For example, a maximal thickness of the long spin lifetime layer 130 can be smaller than about 2 times (or smaller than about 1.5 times, or smaller than about 1 time) a maximal thickness of at least one of the first tunnel barrier layer 120-1 and the second tunnel barrier layer 120-2. In some examples, the maximal thickness of the first and/or the second tunnel barrier layer 120-1, 120-2, can range from about 0.5 nm to about 3 nm (e.g., a nominal thickness of the first and/or the second tunnel barrier layer may be approximately 1 nm), whereas the maximal thickness of the long spin lifetime layer 130 can range between about 0.25 nm and about 2 nm. The thickness of the long spin lifetime layer 130 may depend on its material composition.

The long spin lifetime layer 130 can comprise a material based on at least one of graphene, epitaxial graphene, carbon nanospheres, transition metal dichalcogenide monolayers, a superconductor, gallium-arsenide quantum well, body-centered cubic crystalline cobalt iron alloy, or methylammonium lead iodide. These materials may (at least partially) retain the spin polarity of a current injected into the long spin lifetime layer 130, so that the long spin lifetime layer 130 can exhibit a spin coherence degradation of less than 30%.

Transition metal dichalcogenide (TMDC) monolayers can, for example, comprise molybdenum disulfide ($MoS_2$), tungsten disulfide ($WS_2$), molybdenum diselenide ($MoSe_2$), tungsten diselenide ($WSe_2$), and/or molybdenum ditelluride ($MoTe_2$). A superconductor can, for example, comprise superconducting aluminum, superconducting tantalum, and/or any other superconducting material. Gallium-arsenide quantum well (e.g., $GaAs/Al_{0.3}Ga_{0.7}As$), body-centered cubic crystalline cobalt iron alloy (BCC crystalline $Co_{30}Fe_{70}$), and methylammonium lead iodide ($CH_3NH_3PbI_3$) are examples of 2-D metallic and/or semiconductor materials exhibiting conservation of spin when the strengths of their Rashba and Dresselhaus spin orbit coupling interactions are equal. Any of these kind of materials may be used for implementing the long spin lifetime layer 130, for example.

The first ferromagnetic layer 110-1 and the second ferromagnetic layer 110-2 can comprise iron (Fe), nickel (Ni), cobalt (Co), gadolinium (Gd), any alloy thereof (e.g., cobalt-iron (CoFe), nickel-iron (NiFe), cobalt-iron-nickel (CoFeNi), etc.), and/or any alloy thereof coupled with boron (e.g., iron-boron (FeB), cobalt-iron-boron (CoFeB), etc.).

The first tunnel barrier layer 120-1 and the second tunnel barrier layer 120-2 can comprise magnesium oxide (MgO), aluminum oxide (AlO and/or $Al_2O_3$), aluminum nitride (AlN), titanium-alloyed aluminum oxide (TiAlO), titanium oxide ($TiO_2$), strontium titanium oxide (STO), tantalum oxide ($TaO_x$), and/or zinc oxide (ZnO), for example.

The spintronic device 100 can be implemented within a layer stack mounted on a semiconductor substrate, for example. From a surface (e.g., the front side surface) of the semiconductor upwards, the layers of the spintronic device 100 can be stacked in the order of first the first ferromagnetic layer 110-1, then the first tunnel barrier layer 120-1, then the long spin lifetime layer 130, then the second tunnel barrier layer 120-2, and finally the second ferromagnetic layer 110-2. Additional layers (e.g., insulating layers and/or wiring layers) of the layer stack can be located between the spintronic device 100 and the semiconductor substrate and/or between the spintronic device 100 and a top layer of the layer stack. The first, second, and/or third electrode structure 141, 142, 143 can comprise vertical and/or lateral wiring elements located within the layer stack. In this way, the spintronic device 100 can be integrated into a semiconductor device and be combined with additional circuitry of the semiconductor device. For example, the spintronic device 100 can be integrated into a transceiver integrated circuit (IC) that comprises a transmit signal path connected to the first ferromagnetic layer 110-1 (and/or the second electrode structure 142) and a receive signal path connected to the second ferromagnetic layer 110-2 (and/or the third electrode structure 143). Additionally, the transceiver IC may comprise an integrated antenna connected to the long spin lifetime layer 130 (and/or the first electrode structure 141).

According to an example of a spintronic device, each the first and the second ferromagnetic layer 110-1, 110-2 comprise cobalt-iron-boron alloy and have each a nominal thickness of approximately 2.4 nm. Each the first and the second tunnel barrier layer 120-1, 120-2 comprise magnesium oxide and have each a nominal thickness of 0.95 nm. The long spin lifetime layer 130 comprises superconducting tantalum and has a nominal thickness of 0.4 nm.

Figure 2:
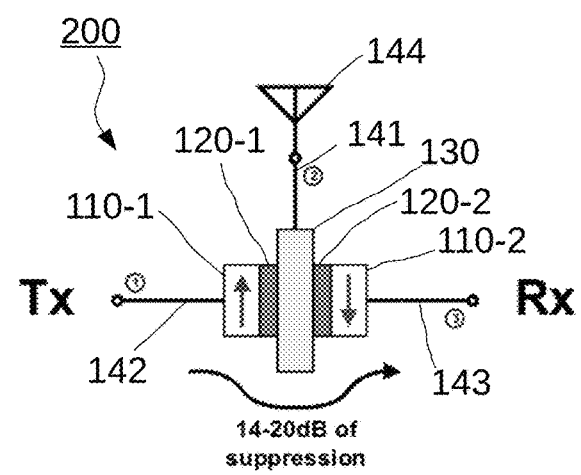
FIG. 2 shows schematic diagram of a spintronic device used as a duplexer.
Figure 2:
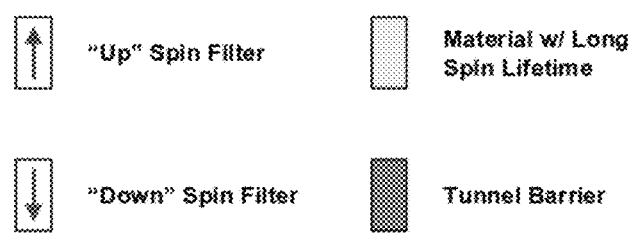

FIG. 2 shows a schematic diagram of a spintronic device 200 used as a duplexer. The spintronic device 200 may be similar to the spintronic device 100 of FIG. 1.

The 3-terminal spintronic device 200 can be used in a spin-based circulator. The spintronic device 200 comprises two ferromagnetic layers 110-1, 110-2 polarized in opposite directions (the "UP" and "DOWN" spin filters) with two thin tunneling barrier layers 120-1, 120-2 (which can be some sort of semiconductor/metal oxide) on either side of a material of long spin lifetime (e.g., a long spin lifetime layer 130). A material with a long spin lifetime can be a metal or semiconductor capable of retaining the spin polarity of any current injected into it (other metals or semiconductors may rapidly depolarizes a spin current such that the resulting current can be of 50% spin "UP" and 50% spin "DOWN"). Spin-polarization P can take on a value between 0 (completely unpolarized) and 1 (100% polarization) and is given by Equation 2:

$$P = \frac{J_{"up"} - J_{"down"}}{J_{"up"} + J_{"down"}}$$

$J_{"up"}$ denotes the total electron current density of all electrons exhibiting a positive (i.e. in the "up" direction) intrinsic angular momentum, or spin quantum number, in their quantum state. $J_{"down"}$ denotes the total electron current density of all electrons exhibiting a negative (i.e. in the "down" direction) intrinsic angular momentum, or spin quantum number, in their quantum state.

There can be several equivalent mathematical ways to express spin polarization. One possibility to actually physically measure spin polarization is to use the current density "J" for spin "up" and spin "down" electrons. These densities can be determined for a material (or a structure) by subjecting it to external magnetic fields of varying strength and direction and then measuring the material's (or the structure's) conductivity.

As explained in context of FIG. 1, fabrication friendly materials with long spin lifetimes can, for example, be graphene, superconducting aluminum/tantalum, etc. The polarized ferromagnetic layers 110-1, 110-2 can act as spin filters: that is to say that they will only pass an electrical current if it is spin polarized in the same direction. The efficiency of this spin filtering action can dependent upon the particular materials properties of the ferromagnetic layer. For example, cobalt-iron-boron alloy is a ferromagnetic material, which can achieve 90% (or more) spin polarization. That is to say, if an un-polarized current (50% "UP" and 50% "DOWN") were to be injected into a spin "UP" polarized layer, the output current would be 90% spin "UP" and 10% spin "DOWN".

In this device configuration, port (1) (e.g., the second electrode structure 142 of the spintronic device 200) is connected to a transmit signal path (Tx), port (2) (e.g., the first electrode structure 141 of the spintronic device 200) is connected to an antenna 144, and port (3) (e.g., the third electrode structure 143 of the spintronic device 200) is connected to a receive signal path (Rx). A signal injected into the device by the transmit signal path (or by a transmitter) can become spin polarized "UP." Similarly, any signal injected by the receive signal path (or by a receiver) can be spin polarized "DOWN". Because the transmit signal is spin "UP," it will be filtered out by the spin "DOWN" filter (e.g., the second ferromagnetic layer 110-2). Signals injected from the antenna might not be spin polarized: the spin "UP" component of the signal can pass out through the transmit port (e.g., the first ferromagnetic layer 110-1) and the spin "DOWN" component through the receive port (e.g., the second ferromagnetic layer 110-2).

The loss between ports of the spintronic device 200 can be quantified based on the spin-polarization P of the spintronic device 200. The loss from the transmit signal path (e.g., the second electrode structure 142) to the antenna 144 (or from the receive signal path (e.g., the third electrode structure 143) to the antenna 144) can be approximately equal to $-20 \log_{10}(P)$ [dB], while the loss from the transmit signal path to the receive signal path (or vice versa) is approximately equal to $-20 \log_{10}(1-P)$ [dB]. Since, according to some examples, there may be no spin-based filtering seen at the input of the antenna 144 (port (2) or the first electrode structure 141), the spintronic device 200 can act as an impedance matched resistive divider such that loss from the antenna 144 to the receive signal path and/or the transmit signal path can be approximately equal to 3.01 [dB].

Figure 3A:
FIGS. 3a-b show tables with performance data of a spintronic device.
Figure 3B:

Table 300-A of FIG. 3A and table 300-B of FIG. 3B summarize the total path loss, insertion loss, and isolation that a spin-based circulator (e.g., the spintronic device 200) can provide based upon a magnetic tunnel junction (MTJ) device TMR. TMR can be a way to measure the spin polarization of a device by taking the ratio between the high and low resistive states of the device. As an example, a double barrier MTJ with CoFeB ferromagnets, MgO insulators, and a superconducting tantalum 5th layer in the middle can produce devices with 1000% (or higher) TMR, resulting in an estimated insertion loss of 0.4 dB for an isolation of 23.6 dB.

In table 300-A, the path loss from (1) to (2) refers to the insertion loss for a signal traveling from port (1) to port (2). The path loss from (1) to (3) refers to the insertion loss for a signal traveling from port (1) to port (3). The path loss from (2) to (1)/(3) refers to the insertion loss for a signal traveling from port (2) to port (1) or from port (2) to port (3). Herein, port (1) corresponds to the second electrode structure 142, port (2) to the first electrode structure 141, and port (3) to the third electrode structure 143 of the spintronic device 200.

In table 300-B, the insertion loss corresponds to the path loss from port (1) to port (2) of table 300-A. Furthermore the isolation in table 300-B is calculated as the path loss from port (1) to port (3) minus the path loss from port (2) to port (3). In other words, the isolation denotes the difference in relative signal levels at the receive signal path if a signal at port (2) is received with the same power as a signal is transmitted from the transmit signal path at port (1).

Figure 4:
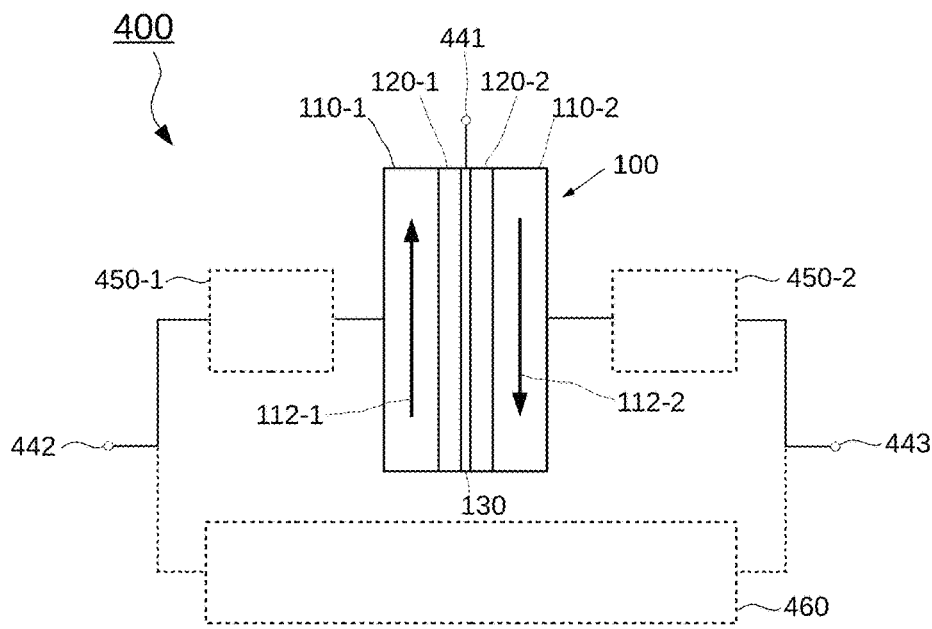
FIG. 4 shows a schematic diagram of a duplexer device.

FIG. 4 shows a schematic diagram of a duplexer device 400. The duplexer device 400 comprises a spintronic device 100. The spintronic device 100 comprises a first ferromagnetic layer 110-1. The first ferromagnetic layer 110-1 comprises a first direction of magnetic polarization 112-1. Furthermore, the spintronic device 100 comprises a second ferromagnetic layer 110-2. The second ferromagnetic layer 110-2 comprises a second direction of magnetic polarization 112-2 opposite to the first direction 112-1. Furthermore, the spintronic device 100 comprises a long spin lifetime layer 130. Furthermore, the spintronic device 100 comprises a first tunnel barrier layer 120-1 disposed between the first ferromagnetic layer 110-1 and the long spin lifetime layer 130. Furthermore, the spintronic device 100 comprises a second tunnel barrier layer 120-2 disposed between the second ferromagnetic layer 110-2 and the long spin lifetime layer 130. Furthermore, the duplexer device 400 comprises a transmit port 442 connected to the first ferromagnetic layer 110-1 of the spintronic device 100. Furthermore, the duplexer device 400 comprises a receive port 443 connected to the second ferromagnetic layer 110-2 of the spintronic device 100. Furthermore, the duplexer device 400 comprises a transceive port 441 connected to the long spin lifetime layer 130 of the spintronic device 100.

By connecting the spintronic device 100 in the described manner within a duplexer device, size and manufacturing costs of the duplexer device can be reduced, while maintaining a high isolation between the transmit port 442 and the receive port 443 and while providing a low insertion loss between the transmit port 442 and the transceive port 441 and/or a low insertion loss between the transceive port 441 and the receive port 443 of the duplexer device 400. In the duplexer device 400, electron spin can be used as a mechanism to encode and isolate transmit (Tx) and receive (Rx) signals to accomplish full duplex communication.

While other circulators (e.g., used in duplexers) with 40 dB (or more) of isolation are often off-chip components that can require tens of square millimeters (mm2) of space, at least some examples of the proposed duplexer device 400 may only occupy on the order square micrometers ($\mu m^2$) of area (or square nanometers $nm^2$, or less) which can be integrated on-chip with reduced manufacturing effort. For instance, in a 14 nm semiconductor manufacturing process, a 3-terminal spintronic device 100 can occupy less than 200 nm×200 nm area and achieve 20 dB (or more) of isolation.

In some examples, the transceive port 441 can correspond to (e.g., be) the long spin lifetime layer 130 and/or an optional first electrode structure of the spintronic device 100 connected to the long spin lifetime layer 130. The transmit port 442 can correspond to (e.g., be) the first ferromagnetic layer 110-1 and/or an optional second electrode structure of the spintronic device 100 connected to the first ferromagnetic layer 110-1. The receive port 443 can correspond to (e.g., be) the second ferromagnetic layer 110-2 and/or an optional third electrode structure of the spintronic device 100 connected to the second ferromagnetic layer 110-2.

The duplexer device 400 can further comprise a first N-path filter 450-1 coupled between the transmit port 442 and the first ferromagnetic layer 110-1 of the spintronic device 100. Additionally, the duplexer device 400 can comprise a second N-path filter 450-2 coupled between the second ferromagnetic layer 110-2 of the spintronic device 100 and the receive port 443. Additionally, the duplexer device 400 can comprise a compensation signal path 460 coupled between the transmit port 442 and the receive port 443. Through the use of the (non-reciprocal) N-path filters 450-1, 450-2, isolation between the transmit port 442 and the receive port 443 can be further enhanced. For example, a share of a transmit signal (e.g., a share of the power of the transmit signal) leaking through the first N-path filter 450-1, the spintronic device 100, and the second N-path filter 450-2 to the receive port 443 can be compensated (e.g., interfere destructively) with another share of the transmit signal reaching the receive port 443 via the compensation signal path 460.

The compensation signal path 460 can be connected in parallel to a series connection of the first N-path filter 450-1, the spintronic device 100, and the second N-path filter 450-2, for example. This can enable providing a signal at the receive port 443 compensating the share of the transmit signal leaking via the spintronic device 100 to the receive port 443.

A phase response of the compensation signal path 460 can be out of phase relative to a phase response from the transmit port 442 to the receive port 443 via the first N-path filter 450-1, the spintronic device 100, and the second N-path filter 450-2. This can cause destructive interference between the share of the transmit signal leaking through the first N-path filter 450-1, the spintronic device 100, and the second N-path filter 450-2 to the receive port 443 with the share of the transmit signal reaching the receive port 443 via the compensation signal path 460. In turn, isolation between the transmit port 442 and the receive port 443 can be enhanced.

In other words, the compensation signal path 460 can create a duplicate signal path between the transmit port 442 and the receive port 443 with a substantial 180 degrees phase shift. For instance, the relative phase shift between the two signal paths may vary between 170 degree and 190 degree due to manufacturing tolerances and/or electrical design limitations.

Moreover, a magnitude response of the compensation signal path 460 can correspond to (e.g., be substantially equal to) a magnitude response from the transmit port 442 to the receive port 443 via the first N-path filter 450-1, the spintronic device 100, and the second N-path filter 450-2. This can further enhance isolation between the transmit port 442 and the receive port 443. For example, the magnitude response of the compensation signal path 460 can differ from the magnitude response from the transmit port 442 to the receive port 443 via the first N-path filter 450-1, the spintronic device 100, and the second N-path filter 450-2 by less than 3 dB (or less than 2 dB, or less than 1 dB, or less than 0.5 dB).

For designing and/or implementation of the compensation signal path 460, the phase response and/or the magnitude response from the transmit port 442 to the receive port 443 via the first N-path filter 450-1, the spintronic device 100, and the second N-path filter 450-2 can be simulated and/or measured. The compensation signal path 460 can then be designed and implemented according to these simulation and/or measurement results. The phase response of the compensation signal path 460 can be designed to be out of phase relative to the phase response from the transmit port 442 to the receive port 443 via the first N-path filter 450-1, the spintronic device 100, and the second N-path filter 450-2 at least within the operational frequency range (e.g., the frequency range of transmit and/or receive signals) of the duplexer device 400. Likewise, the magnitude response of the compensation signal path 460 can be designed to correspond to (e.g., be substantially equal to) the magnitude response from the transmit port 442 to the receive port 443 via the first N-path filter 450-1, the spintronic device 100, and the second N-path filter 450-2 at least within the operational frequency range of the duplexer device 400.

For example, the compensation signal path 460 can comprise at least one phase shifting element and an attenuation element. The phase shifting element and the attenuation element can be fixed and/or adjustable elements. For example, the phase shifting element and the attenuation element may be commonly integrated into an analog and/or a digital filter. The phase shifting element may be implemented as an all-pass filter. For example, the phase shifting element can comprise a transmission line of a tuned length and/or a tunable phase shifter. The attenuation element can comprise resistors that are, for instance, arranged in a Pi- or in a T-configuration, and/or can comprise any other kind of fixed RF attenuator and/or (electronically) tunable attenuator.

The phase shift of the phase shifting element and/or the attenuation of the attenuation element can be fixed during design of the duplexer device 400 and/or can be determined and set during a calibration routine of the duplexer device 400. During such a calibration routine, a transmit signal (or any other calibration signal) can be fed into the transmit port 442 and the power (or voltage or current) of the transmit signal (or the transmit signal itself) can be measured at the receive port 443. For this measurement, a receiver (or receive signal path) connected to the receive port 443 can be employed. Alternatively or additionally, a power detector connected to the receive port 443 can be employed. The phase shift of the phase shifting element and/or the attenuation of the attenuation element (and/or control voltages of the first and/or the second N-path filter 450-1, 450-2) can then be adjusted (e.g., calibrated) until the power of the transmit signal leaking into the receive port 443 becomes minimal (or until the transmit signal received at the receive port 433 substantially vanishes). The determined phase shift of the phase shifting element and/or the attenuation of the attenuation element (and/or the control voltages of the first and/or the second N-path filter 450-1, 450-2) can then be stored in an optional additional memory of the duplexer device 400.

According to some examples, the attenuation element can be realized as a second spintronic device corresponding to the (first) spintronic device 100 of the duplexer device 400. For example, the second spintronic device of the compensation signal path 460 can be identically constructed (neglecting manufacturing tolerances) as the first spintronic device 100 that is used for separating transmit and receive signals. To this end, a first ferromagnetic layer of the second spintronic device can be connected (optionally via the phase shifting element) to the transmit port 442, and a second ferromagnetic layer of the second spintronic device can be connected (optionally via the phase shifting element or an additional phase shifting element) to the receive port 442. The long spin lifetime layer of the second spintronic device can be connected to an impedance providing substantially the same input impedance that is seen from the transceive port 441 in an application, to an impedance providing an input impedance matched to the system impedance of the duplexer device 400, or can be left open. Realizing the attenuation element as a second spintronic device can facilitate matching the magnitude response of the compensation signal path 460 to that from the transmit port 442 to the receive port 443 via the first N-path filter 450-1, the spintronic device 100, and the second N-path filter 450-2.

The first and the second N-path filter 450-1, 450-2 can enable providing a positive phase shift to the share of the transmit signal leaking into the receive port 443 via the (first) spintronic device 100. The compensation signal path 460 can, for instance, provide a negative phase shift for the share of the transmit signal arriving at the receive port 443 via the compensation signal path 460. This can facilitate the phase response of the compensation signal path 460 being out of phase relative to the phase response from the transmit port 442 to the receive port 443 via the first N-path filter 450-1, the spintronic device 100, and the second N-path filter 450-2.

According to some examples, the compensation signal path 460 comprises a third N-path filter and a fourth N-path filter. Furthermore, the compensation signal path 460 can comprise a second spintronic device. The third N-path filter can be coupled between the transmit port 442 and the first ferromagnetic layer of the second spintronic device. The fourth N-path filter can be coupled between the second ferromagnetic layer of the second spintronic device and the receive port 443. In this way, the compensation signal path 460 can be constructed corresponding to (e.g., be identically constructed as) the signal path from the transmit port 442 to the receive port 443 via the first N-path filter 450-1, the first spintronic device 100, and the second N-path filter 450-2 (neglecting manufacturing tolerances). In turn, this can facilitate the magnitude response of the of the compensation signal path 460 to correspond the magnitude response from the transmit port 442 to the receive port 443 via the first N-path filter 450-1, the first spintronic device 100, and the second N-path filter 450-2, and can facilitate the phase response of the compensation signal path 460 to be out of phase relative to the phase response from the transmit port 442 to the receive port 443 via the first N-path filter 450-1, the first spintronic device 100, and the second N-path filter 450-2.

For example, the first and the second N-path filter 450-1, 450-2 can be configured to each apply a respective phase shift to a signal (e.g., a share of a transmit signal) propagating from the transmit port 442 to the receive port 443 via the first N-path filter 450-1, the first spintronic device 100, and the second N-path filter 450-2. The third and the fourth N-path filter can be configured to each apply a respective phase shift to a signal (e.g., another share of the transmit signal) propagating from the transmit port 442 to the receive port 443 via the third N-path filter, the second spintronic device, and the fourth N-path filter. The sign of the respective phase shifts applied by the first and the second N-path filter 450-1, 450-2 can be opposite to the sign of the respective phase shifts applied by the third and the fourth N-path filter. For example, the first and the second N-path filter 450-1, 450-2 can provide a positive phase shift, while the third and the fourth N-path filter can provide a negative phase shift (or vice versa). Again, this can facilitate the phase response of the compensation signal path 460 to be out of phase relative to the phase response from the transmit port 442 to the receive port 443 via the first N-path filter 450-1, the first spintronic device 100, and the second N-path filter 450-2.

For instance, the absolute values of the respective phase shifts applied by the first, second, third, and fourth N-path filter can each be larger than about 40 degree (or larger than about 42 degree, or larger than about 44 degree) and smaller than about 50 degree (or smaller than about 48 degree, or smaller than about 46 degree). A nominal value of the respective phase shifts applied by the first, second, third, and fourth N-path filter can each be about 45 degree. Hence, the share of the transmit signal leaking into the receive port 443 via the first spintronic device 100 can (at least partially) destructively interfere with the share of the transmit signal propagating from the transmit port 442 to the receive port 443 via the third N-path filter, the second spintronic device, and the fourth N-path filter.

For a signal propagating from the transmit port 442 to the receive port 443, the first N-path filter 450-1 and the third N-path filter can be configured to provide respective phase responses being equal in absolute value and opposite in sign with respect to each other. Furthermore, the second N-path filter 450-2 and the fourth N-path filter can be configured to provide respective phase responses being equal in absolute value and opposite in sign with respect to each other. This can further enhance isolation between the transmit port 442 and the receive port 443. To this end, the sign of the phase responses of the first and second N-path filter 450-1, 450-2 can be equal and opposite to the sign of the phase responses of the third and fourth N-path filter. This may be accomplished by constructing the first N-path filter 450-1 corresponding to (e.g., identically to) the third N-path filter, but reversing the chronological order of their respective control voltages, and by constructing the second N-path filter 450-2 corresponding to (e.g., identically to) the fourth N-path filter and also reversing the chronological order of their respective control voltages.

An N-path filter (e.g., the first, second, third, and/or fourth N-path filter) can comprise at least one branch (e.g., at least one filter path) comprising two transistors connected in series. A phase shift of the N-path filter can be controlled by a phase shift between respective periodic control voltages of the two transistors. In some examples, an N-path filter comprises a plurality of branches (e.g., a number of N branches) coupled between its input port and its output port, each branch comprising two transistors connected in series. Between the two transistors of each branch, there can be an additional shunt capacitor. The respective control voltages of the transistors can correspond to their respective gate voltages (in case of field-effect transistors) and/or to their respective base voltages (in case of bipolar transistors). The respective control voltages can also be regarded as clock signals of two transistors of a branch of an N-path filter.

The transistor (of a branch) connected to the input port of the N-path filter can be referred to as the input transistor of this branch with an input clock signal applied to its gate (or base). The transistor (of the branch) connected to the output port of the N-path filter can be referred to as the output transistor of this branch with an output clock signal applied to its gate (or base). If the N-path filter is designed to apply a phase shift $\varphi$ to a signal traveling from the N-path filter's input port to its output port, the input and output clock signals can have a frequency that is approximately equal to the frequency of the signal to be shifted in phase. Furthermore, the input and output clock signals can switch on the respective transistors during a share of $\varphi/360°$ of the clock cycle and can have a relative phase shift with respect to each other substantially equal to the phase shift to be applied to the signal (e.g., equal to $\varphi$).

If the signal enters the N-path filter at its input port and exits it at its output port and the phase shift applied to the signal shall be positive, the input clock signal may lead the output clock by the targeted phase shift $\varphi$. If the phase shift to be applied to the signal shall be negative, the input clock signal may lag the output clock by the targeted phase shift $\varphi$. In other words, the phase-shifts applied to signals traveling in opposite directions through the N-path filter and having a frequency near the switching frequency of the clock signals of the N-path filter have opposite signs and are substantially of the same absolute value.

According to some examples, the duplexer device 400 is an integrated circuit. This can reduce the size of the duplexer device 400. Additionally, the duplexer device 400 may comprise peripheral off-chip circuitry, such as power supply circuitry and/or filtering circuitry. In this way, electron spin devices (e.g., the spintronic device 100) coupled with N-path filters (e.g., the first, second, third, and/or fourth N-path filter) can implement a compact circulator. This spin circulator can, for example, be conveniently integrated into a CMOS circuit in an area on the order of square micrometers ($\mu m^2$) or less. The enhanced spin-circulator using non-reciprocal N-path filters (along with clock generation and bias circuitry) and the compensation signal path can fit within an area of 50 $\mu m$ by 50 $\mu m$ (or smaller) and can achieve an isolation of 40 dB to 60 dB, for example. Additionally, the terminal spintronic device (e.g., the spintronic device 100) is very amenable to integration into a CMOS fabrication flow. In some examples, the circulator is partially integrated on-chip while large inductors (if required) can remain off-chip.

Figure 5A:
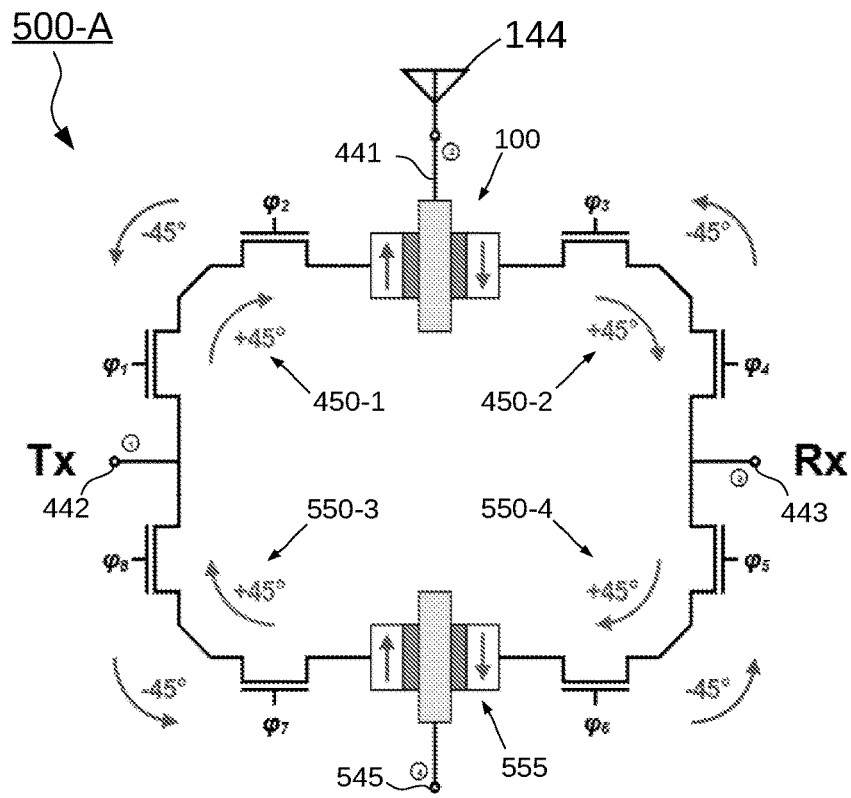
FIG. 5a shows a schematic diagram of a duplexer device with a compensation signal path comprising a second spintronic device as an attenuator element and a third and a fourth N-path filter as phase shifting elements.

FIG. 5a shows a schematic diagram of another duplexer device 500-A with a compensation signal path comprising a second spintronic device 555 as an attenuator element and a third N-path filter 550-3 and a fourth N-path filter 550-4 as phase shifting elements. The duplexer device 500-A may be similar to the duplexer device 400 of FIG. 4.

The insertion loss and the suppression (e.g., the isolation) between the Tx (e.g., the transmit port 442 of the duplexer device 500-A) and Rx (e.g. the receive port 443 of the duplexer device 500-A) can be enhanced through the use of non-reciprocal N-path filters. As detailed in FIG. 5a, four 45 degree non-reciprocal N-path filters and two of the previously discussed 3-terminal spintronic devices can be used to construct this "enhanced" spin-circulator with 4 ports.

A first port of the duplexer device 500-A corresponds to the transmit port 442. A second port of the duplexer device 500-A corresponds to the transceive port 441 of the duplexer device 500-A, which is connected at one side to the long spin lifetime layer of a first spintronic device 100 of the duplexer device 500-A and is connected at the other side to an antenna 144 for transmitting transmit signals and receiving receive signals. The first spintronic device 100 is employed for separating (e.g., duplexing) transmit and receive signals.

A first N-path filter 450-1 is connected between the transmit port 442 and the first ferromagnetic layer of the first spintronic device 100 and comprises a series connection of a first and a second transistor with the control voltages (e.g., clock signals) $\varphi_1$ and $\varphi_2$, respectively. The first transistor is connected to the transmit port 442, whereas the second transistor is connected to the first ferromagnetic layer of the first spintronic device 100. The first N-path filter 450-1 is configured to apply a phase shift of nominally +45 degree in the direction from the transmit port 442 to the first ferromagnetic layer of the first spintronic device 100 and to apply a phase shift of nominally −45 degree in the direction from the first ferromagnetic layer of the first spintronic device 100 to the transmit port 442.

A second N-path filter 450-2 is connected between the second ferromagnetic layer of the first spintronic device 100 and the receive port 443 and comprises a series connection of a third and a fourth transistor with the control voltages (e.g., clock signals) $\varphi_3$ and $\varphi_4$, respectively. The third transistor is connected to the second ferromagnetic layer of the first spintronic device 100, whereas the fourth transistor is connected to the receive port 443. The second N-path filter 450-2 is configured to apply a phase shift of nominally +45 degree in the direction from the second ferromagnetic layer of the first spintronic device 100 to the receive port 443 and to apply a phase shift of nominally −45 degree in the direction from the receive port 443 to the second ferromagnetic layer of the first spintronic device 100.

The receive port 433 corresponds to a third port of the duplexer device 500-A. A fourth port 545 of the duplexer device 500-A is connected to the long spin lifetime layer of the second spintronic device 555 of the compensation signal path. The fourth port 545 can be terminated with an impedance substantially equal to the input impedance of the antenna 144, and/or with the system impedance of the duplexer device 500-A, or can be left open.

The third N-path filter 550-3 is connected between the transmit port 442 and the first ferromagnetic layer of the second spintronic device 555 and comprises a series connection of a seventh and an eighth transistor with the control voltages (e.g., clock signals) $\varphi_7$ and $\varphi_8$, respectively. The seventh transistor is connected to the first ferromagnetic layer of the second spintronic device 555, whereas the eighth transistor is connected to the transmit port 442. The third N-path filter 550-3 is configured to apply a phase shift of nominally −45 degree in the direction from the transmit port 442 to the first ferromagnetic layer of the second spintronic device 555 and to apply a phase shift of nominally +45 degree in the direction from the first ferromagnetic layer of the second spintronic device 555 to the transmit port 442.

The fourth N-path filter 550-4 is connected between the receive port 443 and the second ferromagnetic layer of the second spintronic device 555 and comprises a series connection of a fifth and a sixth transistor with the control voltages (e.g., clock signals) $\varphi_5$ and $\varphi_6$, respectively. The fifth transistor is connected to the receive port 443, whereas the sixth transistor is connected to the second ferromagnetic layer of the second spintronic device 555. The fourth N-path filter 550-4 is configured to apply a phase shift of nominally −45 degree in the direction from the second ferromagnetic layer of the second spintronic device 555 to the receive port 443 and to apply a phase shift of nominally +45 degree in the direction from the receive port 443 to the second ferromagnetic layer of the second spintronic device 555.

Figure 5B:
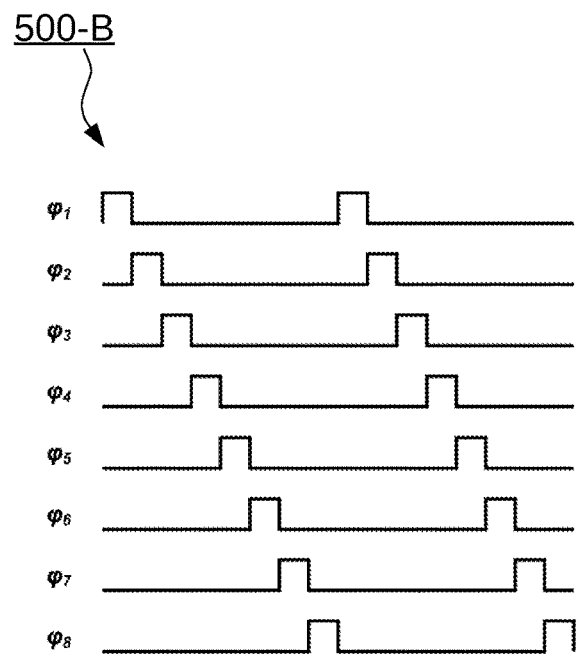

A timing diagram 500-B of the control voltages of the transistors of the first, second, third, and fourth N-path filter 450-1, 450-2, 550-3, 550-4 is displayed in FIG. 5B. All control voltages are periodic signals of the same frequency and are active (e.g., switch the respective transistors on) during an eighth of the period. The first control voltage $\varphi_1$ of the first transistor leads the second control voltage $\varphi_2$ of the second transistor by nominally 45 degree. The second control voltage $\varphi_2$ leads the third control voltage $\varphi_3$ of the third transistor by nominally 45 degree. The third control voltage $\varphi_3$ leads the fourth control voltage $\varphi_4$ of the fourth transistor by nominally 45 degree. The fourth control voltage $\varphi_4$ leads the fifth control voltage $\varphi_5$ of the fifth transistor by nominally 45 degree. The fifth control voltage $\varphi_5$ leads the sixth control voltage $\varphi_6$ of the sixth transistor by nominally 45 degree. The sixth control voltage $\varphi_6$ leads the seventh control voltage $\varphi_7$ of the seventh transistor by nominally 45 degree. The seventh control voltage $\varphi_7$ leads the eighth control voltage $\varphi_5$ of the eighth transistor by nominally 45 degree.

This way, the N-path filters (e.g., the first, second, third, and fourth N-path filter) can apply a phase shift of +45 degrees to signals traveling in the clock wise direction and a phase shift of −45 degree to signals traveling in the counter-clockwise direction, as depicted in FIG. 5A. For example, FIG. 5B shows 45 degree phase shifts applied via N-path filters.

Figures 5C, 5D:
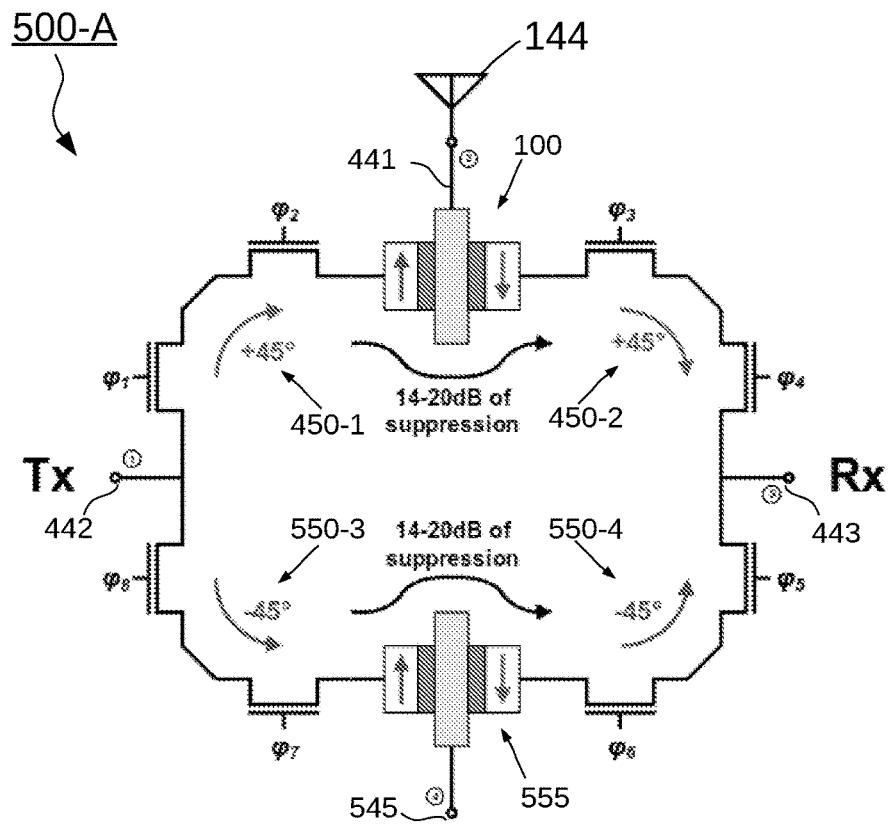

The isolation between the Tx (e.g., the transmit port 442) and Rx (e.g., the receive port 443) can be summarized by FIG. 5C. FIG. 5C shows the phase shifts applied by the N-path filters of the duplexer device 500-A applied to signals traveling from the transmit port 442 to the receive port 443. A signal (e.g., a transmit signal) injected into the Tx can see two paths: the upper path (via the first N-path filter 450-1, the first spintronic device 100, and the second N-path filter 450-2) can attenuate the signal (according to the finite isolation of the first spintronic device 100) and can apply a nominal +90 degrees phase shift. The lower path (e.g., the compensation signal path via the third N-path filter 550-3, the second spintronic device 555, and the fourth N-path filter 550-4) also attenuates the signal (according to the finite isolation of the second spintronic device 555 that can be substantially equal to the isolation of the first spintronic device 100) but instead applies a −90 degrees phase shift. The result can be that addition of the second path (e.g., the compensation signal) provided by the non-reciprocal N-path filter creates a signal 180° out of phase with the first path (via the first N-path filter 450-1, the first spintronic device 100, and the second N-path filter 450-2), effectively canceling out the transmit signal not filtered out by the first spintronic device 100 at the receive port 443. This can be thought of as enhancing the effective spin-polarization P of the first spintronic device 100 through a factor $P_{EFF} \approx P+(1-P)P$. Table 500-D displayed in FIG. 5d shows the effective spin-polarization and device TMR, with greatly improved suppression (e.g., isolation) between ports (e.g., between the transmit port 442 and the receive port 443 of the duplexer device 500-A).

Figure 5E:
FIG. 5e shows a table displaying path loss versus phase/device mismatch in a non-reciprocal N-path filter with eight filter paths (N=8)

Table 500-E of FIG. 5e shows the in-band loss and out-of-band loss of an N-Path filter (e.g., the first, second, third, and/or fourth N-path filter) comprising a number of N=8 branches for varying levels of CMOS device mismatch and clock phase overlap. X % of mismatch can refer to random CMOS transistor mismatch (e.g., device threshold/on resistance difference of X % (10 Ohms vs. 10 Ohms times (1+X/100)), random spintronic device mismatch (e.g., spintronic device resistance seen from the transmit port 442 to the receive port 443 via the first spintronic device 100 is 10 kOhms, and 10.1 kOhms times (1+X/100) via the second spintronic device 555), or to the high levels of the clock signals of two transistors within a branch of an N-Path-Filter (or the switch-on times of these two transistors) overlapping during X % of the high time (or the switch-on times, respectively).

Figure 5F:
FIG. 5f-h show tables displaying the tunnel magnetic resistance versus isolation for a duplexer device according to FIG. 4 and/or FIG. 5a for differing values of mismatch.
Figure 5G:
Figure 5H:

Table 500-F of FIG. 5f, table 500-G of FIG. 5g, and table 500-H of FIG. 5h summarize the insertion loss from the transmit port 442 to the transceive port 441 and isolation (both in- and out-of-band) between the transmit port 442 and the receive port 443 for the enhanced spin-based circulator (e.g., the duplexer device 400 of FIG. 4 and/or the duplexer device 500-A of FIGS. 5a,c). For table 500-F the mismatch is zero. For table 500-G the mismatch amounts to 1.0%. For table 500-H the mismatch amounts to 5.0%. As a point of reference, the spin-based circulator (e.g., the spintronic device of FIG. 1 or FIG. 2) with a TMR of one thousand percent (or more) can achieve an insertion loss of 0.4 dB together with an isolation of 23.6 dB. Using similar MTJ devices (e.g., the first and the second spintronic device) and 1% CMOS device mismatch and clock phase overlap, this can be improved to insertion loss of 0.6 dB for an isolation of 40.4 dB in-band and 65.6 dB out-of-band.

Figure 6A:
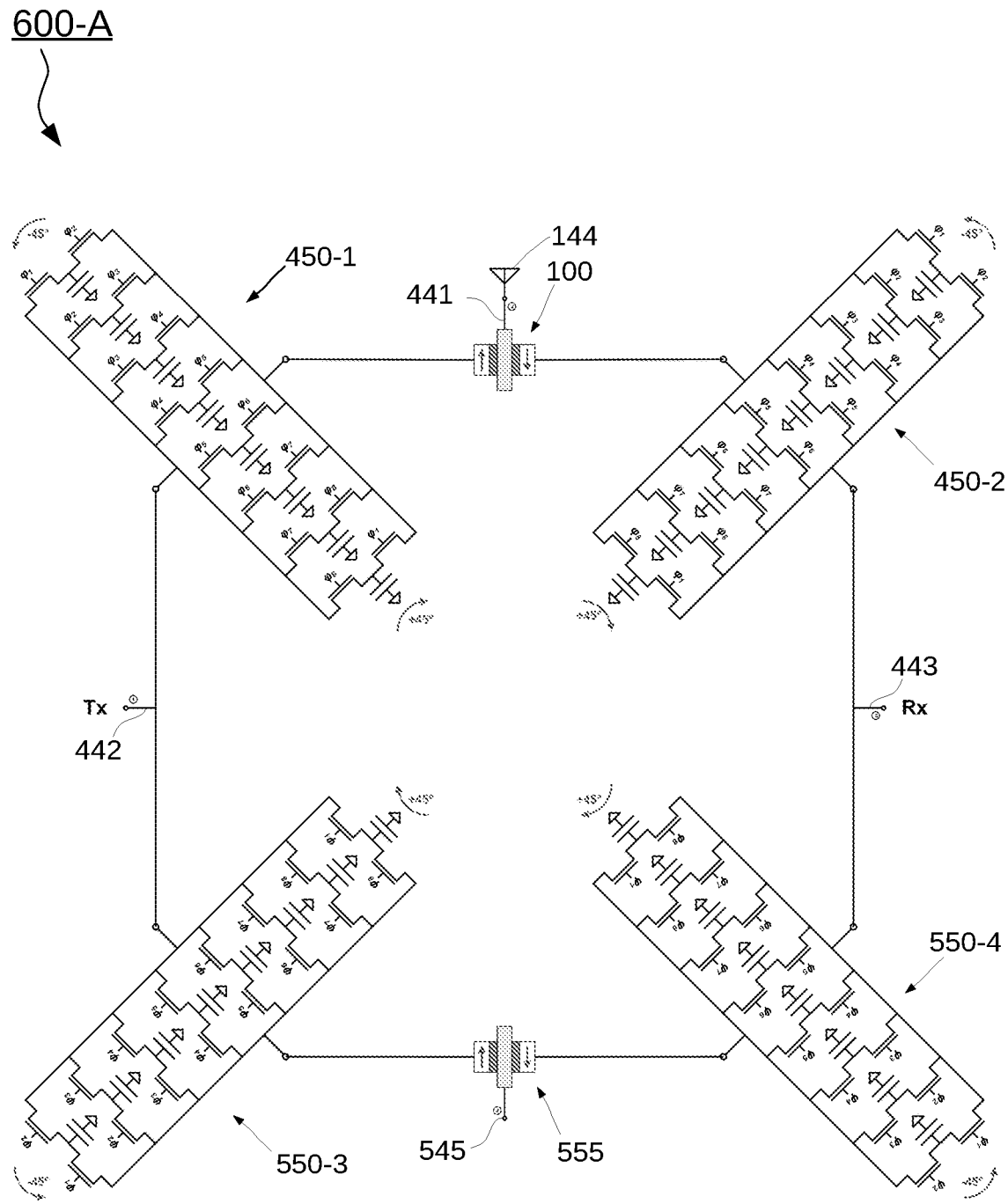
FIG. 6a shows a schematic diagram of another duplexer device comprising four N-path filters, each N-path filter comprising eight filter paths (N=8)
Figure 6B:
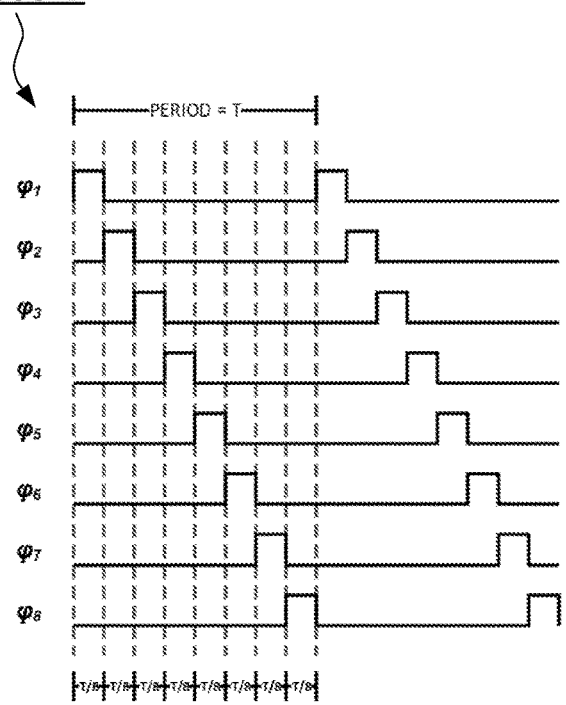

FIG. 6a shows schematic diagram of another duplexer device 600-A comprising four N-path filters. The duplexer device 600-A may be similar to the duplexer device 400 of FIG. 4 or to the duplexer device 500-A of FIG. 5a, c. Each N-path filter of the duplexer device 600-A comprises eight branches (N=8). Each branch comprises a series connection of two field-effect transistors with a shunt capacitor coupled between the transistors. FIG. 6b shows a timing diagram 600-B of the control voltages $\varphi_i$ (i=1, 2, . . . , 8) of the transistors of the N-path filters of the duplexer device 600-A.

The first N-path filter 450-1 of the duplexer device 600-A is connected between a transmit port 442 of the duplexer device 600-A and a first spintronic device 100 of the duplexer device 600-A. The first spintronic device 100 is used for separating transmit and receive signals. The second N-path filter 450-2 of the duplexer device 600-A is connected between the first spintronic device 100 of the duplexer device 600-A and a receive port 443 of the duplexer device 600-A.

A compensation signal path of the duplexer device 600-A is connected between the transmit port 442 and the receive port 443. The compensation signal path comprises the third N-path filter 550-3 of the duplexer device 600-A, a second spintronic device 555 used as an attenuating element, and the fourth N-path filter 550-4 of the duplexer device 600-A. The third N-path filter 550-3 is connected between the transmit port 442 and the second spintronic device 555. The fourth N-path filter 550-4 is connected between the second spintronic device 555 and the receive port 443.

According to the timing diagram 600-B, the control voltages of the transistors of the first N-path filter 450-1 that are connected to the transmit port 442 lead the control voltages of the transistors of the first N-path filter 450-1 that are connected to the first spintronic device 100 by 45 degrees in phase. Thus, the first N-path filter 450-1 can shift a transmit signal leaking from the transmit port 442 to the receive port 443 via the first spintronic device 100 by +45 degrees. Likewise, according to the timing diagram 600-B, the control voltages of the transistors of the second N-path filter 450-2 that are connected to the first spintronic device 100 lead the control voltages of the transistors of the second N-path filter 450-2 that are connected to the receive port 443 by 45 degrees in phase. Thus, also the second N-path filter 450-2 can shift the transmit signal leaking from the transmit port 442 to the receive port 443 via the first spintronic device 100 by +45 degrees. In summation, the first and the second N-path filter 450-1, 450-2 can shift the transmit signal leaking through the first spintronic device 100 by +90 degrees in phase.

On the other hand, according to the timing diagram 600-B, the control voltages of the transistors of the third N-path filter 550-3 that are connected to the transmit port 442 lag the control voltages of the transistors of the third N-path filter 550-3 that are connected to the second spintronic device 555 by 45 degrees in phase. Thus, the third N-path filter 550-3 can shift a compensating share of the transmit signal propagating from the transmit port 442 to the receive port 443 via the second spintronic device 555 by −45 degrees.

Similarly, according to the timing diagram 600-B, the control voltages of the transistors of the fourth N-path filter 550-4 that are connected to the second spintronic device 555 lag the control voltages of the transistors of the fourth N-path filter 555-4 that are connected to the receive port 443 by 45 degrees in phase. Hence, the fourth N-path filter 550-4 can shift the compensating share of the transmit signal propagating from the transmit port 442 to the receive port 443 via the second spintronic device 555 by −45 degrees in phase, too. Consequently, the third and the fourth N-path filter 550-3, 550-4 can shift the compensating share of the transmit signal by −90 degrees. Therefore, the compensating share of the transmit signal is out of phase with the transmit signal leaking through the first spintronic device 100 at the receive port 443. Because the first, second, third, and fourth N-path filter 450-1, 450-2, 550-3, 550-4 can be identically constructed (neglecting manufacturing tolerances) and the first and second spintronic device 100, 555 can also be identically constructed (neglecting manufacturing tolerances), the magnitude of the compensating share of the transmit signal can substantially equal the magnitude of the transmit signal leaking through the first spintronic device 100. Hence, at the receive port 443 the compensating share of the transmit signal can (at least partially) cancel the transmit signal leaking through the first spintronic device 100. In turn, the isolation between the transmit port 442 and the receive port 443 can be enhanced.

In possible variations of the duplexer device 600-A, the first and the second N-path filter 450-1, 450-2 may be constructed differently with respect to each other, and the third and the fourth N-path filter 550-3, 550-4 may also be constructed differently with respect to each other. However, the first N-path filter may then be constructed identically to the third N-path filter 550-3 and the second N-path filter 450-2 may be constructed identically to the fourth N-path filter 550-4 (neglecting manufacturing tolerances). Again, the timing of the control voltages of the first and the third N-path filter 450-1, 550-3 and the timing of the control voltages of the second and the fourth N-path filter 450-2, 550-4 may be inverted with respect to each other. Matching the signal path from the transmit port 442 to the receive port 443 via the first N-path filter 450-1, the first spintronic device 100, and the second N-path filter 450-2 to the compensation signal path in the described manner, can then enhance the isolation between the transmit port 442 and the receive port 443.

Moreover, for each of the four N-path filters 450-1, 450-2, 550-3, 550-4 of the duplexer device 600-A, there is always an input transistor of a branch and an output transistor of another branch switched on at a time according to the timing diagram 600-B (neglecting jitter). This can reduce the insertion loss of the N-path filters. Thus, a transmit signal propagating from the transmit port 442 via the first N-path filter 450-1 and the first spintronic device 100 to the transceive port 441 (and to the antenna 144) can be attenuated less, so that the power consumption of a transceiver device utilizing the duplexer device 600-B may be less affected by the first N-path filter 450-1.

Figure 7:
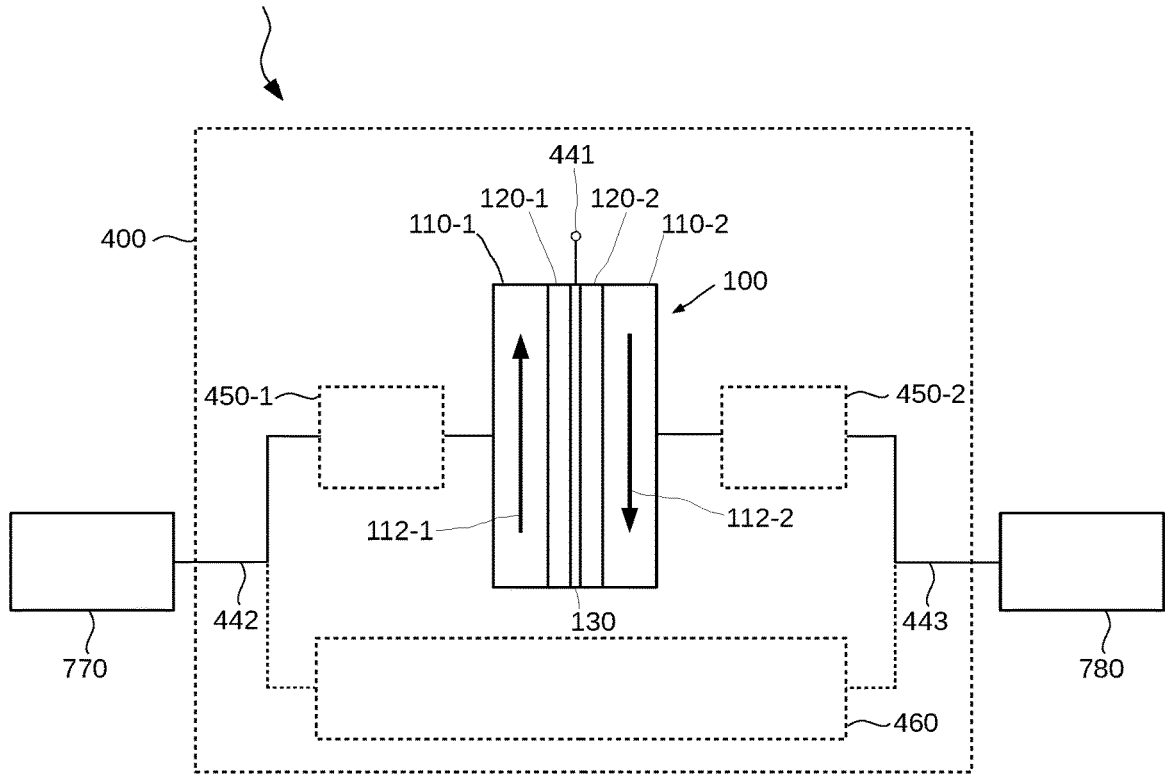
FIG. 7 shows a schematic diagram of a transceiver device.

FIG. 7 shows a schematic diagram of a transceiver device 700. The transceiver device 700 comprises a duplexer device 400. The duplexer device 400 comprises a spintronic device 100. The spintronic device 100 comprises a first ferromagnetic layer 110-1. The first ferromagnetic layer 110-1 comprises a first direction of magnetic polarization 112-1. Furthermore, the spintronic device 100 comprises a second ferromagnetic layer 110-2. The second ferromagnetic layer 110-2 comprises a second direction of magnetic polarization 112-2 opposite to the first direction 112-1. Furthermore, the spintronic device 100 comprises a long spin lifetime layer 130. Furthermore, the spintronic device 100 comprises a first tunnel barrier layer 120-1 disposed between the first ferromagnetic layer 110-1 and the long spin lifetime layer 130. Furthermore, the spintronic device 100 comprises a second tunnel barrier layer 120-2 disposed between the second ferromagnetic layer 110-2 and the long spin lifetime layer 130. Furthermore, the duplexer device 400 comprises a transmit port 442 connected to the first ferromagnetic layer 110-1 of the spintronic device 100. Furthermore, the duplexer device 400 comprises a receive port 443 connected to the second ferromagnetic layer 110-2 of the spintronic device 100. Furthermore, the duplexer device 400 comprises a transceive port 441 connected to the long spin lifetime layer 130 of the spintronic device 100. Furthermore, the transceiver device 700 comprises a transmit signal path 770 connected to the transmit port 442 of the duplexer device 400. Furthermore, the transceiver device 700 comprises a receive signal path 780 connected to the receive port 443 of the duplexer device.

By using a duplexer device with a spintronic device within a transceiver device, an overall size of the transceiver device can be reduced. For example, the transceiver device can be an integrated circuit (IC) and the duplexer device with the spintronic device can be integrated into this transceiver IC. This can avoid using off-chip circulators for duplexing of transmit and receive signals, and thus an increased insertion loss for the transmit and/or receive signals and/or can safe space on a printed circuit board.

The transceiver device 700 can be configured to simultaneously provide a transmit signal and to receive a receive signal at the transceive port 441 of the duplexer device 400. A frequency of the transmit signal can be equal to a frequency of the receive signal. In other words, the transceiver device 700 can be configured for full-duplex communication. This can increase (e.g., double) the data throughput of the transceiver device 700. The frequency bands of the transmit and receive signal may be identically or may partially overlap each other.

A transmit signal output port of the transmit signal path 770 can be connected to the transmit port 442 of the duplexer device 400. The transmit signal path 770 may comprise digital, mixed signal, and/or analog signal processing circuitry for providing a transmit signal, such as filtering, matching, amplifying, frequency conversion, modulation, memory, predistortion, and/or digital-to-analog conversion circuitry. A receive signal input port of the receive signal path 780 can be connected to the receive port 443 of the duplexer device 400. The receive signal path 780 may comprise analog, mixed signal, and/or digital signal processing circuitry for receiving a receive signal, such as filtering, matching, amplifying, frequency conversion, demodulation, evaluation, memory, equalization, and/or analog-to-digital conversion circuitry. The transmit and the receive signal path 770, 780 may also be implemented by means of software defined radio.

Optionally, the duplexer device 400 of the transceiver device 700 can comprise optional and/or additional features of the duplexer devices explained within the context of FIGS. 4-6b. The spintronic device 100 of the duplexer device 400 of the transceiver device 700 can comprise optional and/or additional features of the spintronic devices explained within the context of FIGS. 1-3b.

Figure 8:
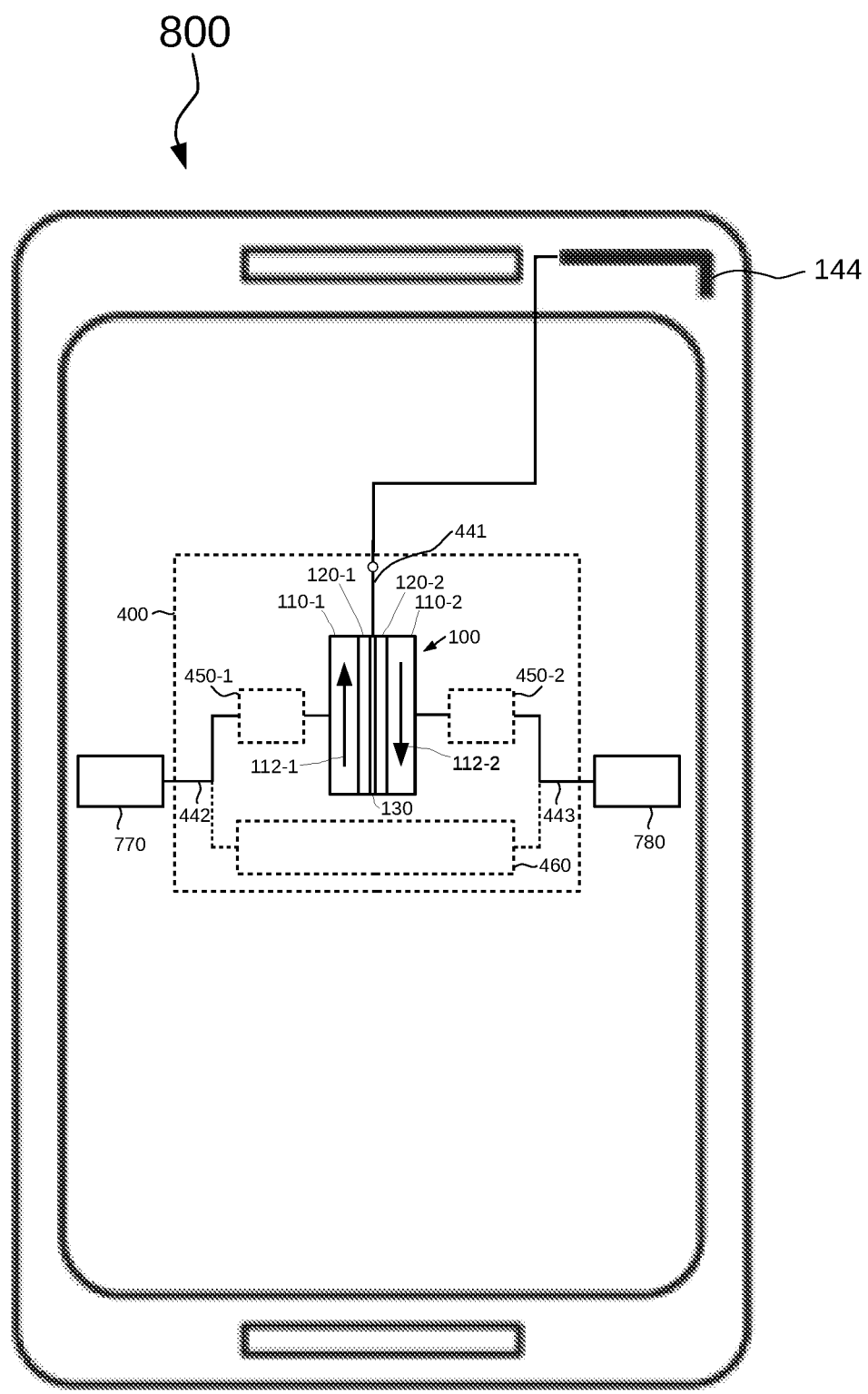
FIG. 8 shows a schematic diagram of a telecommunication device.

FIG. 8 shows a schematic diagram of a telecommunication device 800. The telecommunication device 800 comprises a transceiver device 700. The transceiver device 700 comprises a duplexer device 400. The duplexer device 400 comprises a spintronic device 100. The spintronic device 100 comprises a first ferromagnetic layer 110-1. The first ferromagnetic layer 110-1 comprises a first direction of magnetic polarization 112-1. Furthermore, the spintronic device 100 comprises a second ferromagnetic layer 110-2. The second ferromagnetic layer 110-2 comprises a second direction of magnetic polarization 112-2 opposite to the first direction 112-1. Furthermore, the spintronic device 100 comprises a long spin lifetime layer 130. Furthermore, the spintronic device 100 comprises a first tunnel barrier layer 120-1 disposed between the first ferromagnetic layer 110-1 and the long spin lifetime layer 130. Furthermore, the spintronic device 100 comprises a second tunnel barrier layer 120-2 disposed between the second ferromagnetic layer 110-2 and the long spin lifetime layer 130. Further-more, the duplexer device 400 comprises a transmit port 442 connected to the first ferromagnetic layer 110-1 of the spintronic device 100. Furthermore, the duplexer device 400 comprises a receive port 443 connected to the second ferromagnetic layer 110-2 of the spintronic device 100. Furthermore, the duplexer device 400 comprises a transceive port 441 connected to the long spin lifetime layer 130 of the spintronic device 100. Furthermore, the transceiver device 700 comprises a transmit signal path 770 connected to the transmit port 442 of the duplexer device 400. Furthermore, the transceiver device 700 comprises a receive signal path 780 connected to the receive port 443 of the duplexer device.

Using a transceiver device 700 of the described kind within a telecommunication device 800, can reduce the size and/or the weight of the telecommunication device and/or can ease space requirements within the telecommunication device 800. Moreover, if the transceiver device 700 is configured for full-duplex communication, the data throughput of the telecommunication device can be increased (e.g., doubled).

The telecommunication device 800 can additionally comprise an antenna 144 connected to the transceive port 441 of the duplexer device 400. In this way, the telecommunication device 800 can be configured for wireless communication (e.g., for wireless full-duplex communication).

The telecommunication device 800 can be a stationary or a mobile device. Telecommunication devices according to the examples described herein may operate according to every known and future telecommunication standard, such as for example: one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (EUTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

A telecommunications device may correspond to a smart-phone, a cell phone, User Equipment (UE), a laptop, a notebook, a personal computer, a Personal Digital Assistant (PDA), a Universal Serial Bus (USB)-stick, a tablet computer, a car, a base station, a radar system, a relay station, etc. A transmitter, transceiver or terminal may also be referred to as UE or user in line with the 3GPP terminology. A base station transmitter or a base station transceiver can be located in the fixed or stationary part of the network or system. A base station transmitter or a base station transceiver may, for example, correspond to a remote radio head, a transmission point or an access point. A base station transmitter or a base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

Figure 9:
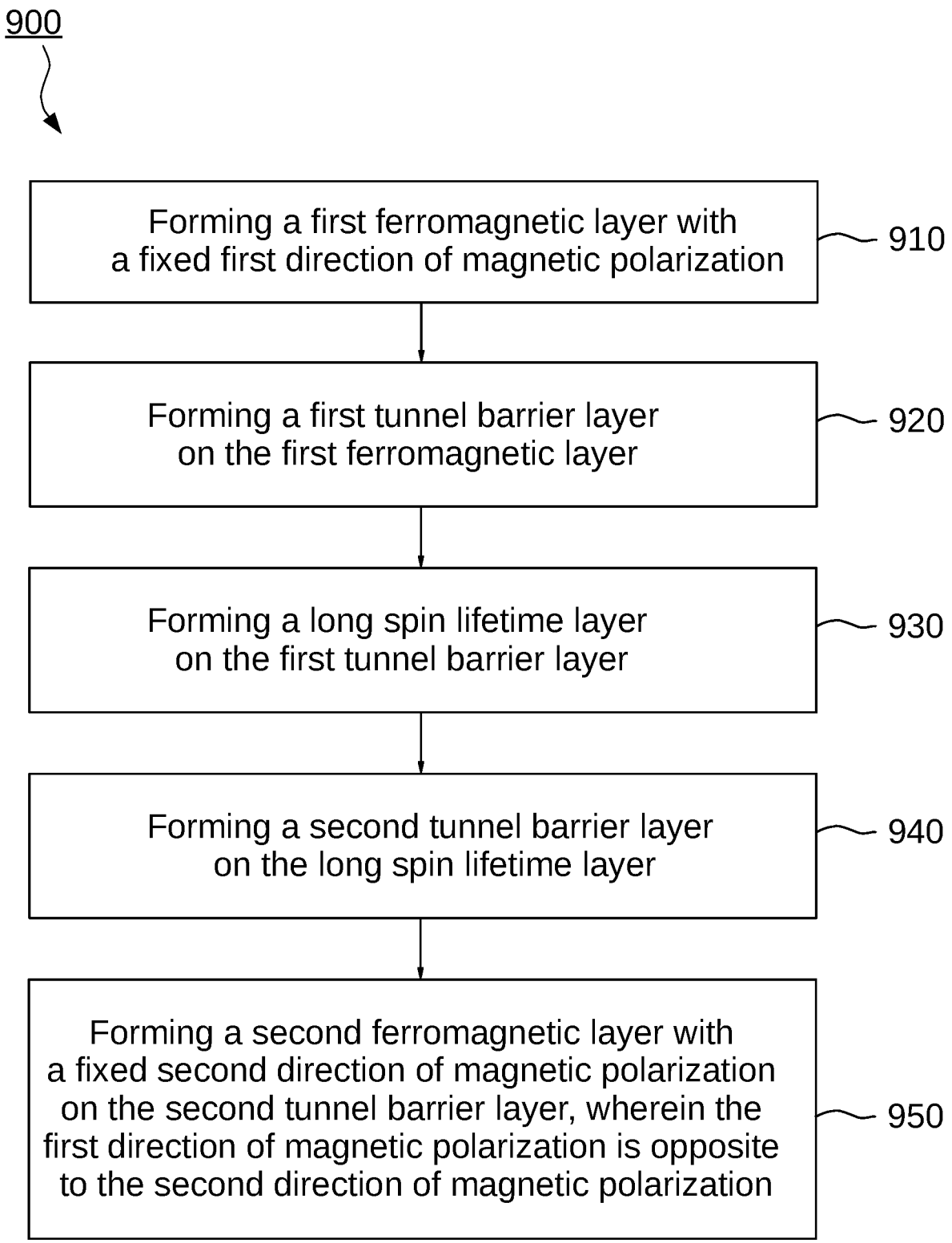
FIG. 9 shows a flow chart of a method for forming a spintronic device.

FIG. 9 shows a flow chart of a method 900 for forming a spintronic device. The method 900 comprises forming 910 a first ferromagnetic layer with a fixed first direction of magnetic polarization. Furthermore, the method 900 comprises forming 920 a first tunnel barrier layer on the first ferromagnetic layer. Furthermore, the method 900 comprises forming 930 a long spin lifetime layer on the first tunnel barrier layer. Furthermore, the method 900 comprises forming 940 a second tunnel barrier layer on the long spin lifetime layer. Furthermore, the method 900 comprises forming 950 a second ferromagnetic layer with a fixed second direction of magnetic polarization on the second tunnel barrier layer. The first direction of magnetic polarization of the first ferromagnetic layer is opposite to the second direction of magnetic polarization of the second ferromagnetic layer.

By forming a spintronic device in the described manner, a spintronic device for usage as a non-reciprocal electronic device and for controlling the direction of flow of currents and/or signals associated with these currents can be provided. For example, the spintronic device can be used for replacing a circulator within an RF circuit.

The method 900 can be integrated into a semiconductor manufacturing process. For example, the spintronic device can be formed within a wiring layer stack mounted on a semiconductor substrate.

The method 900 can further comprise forming a (first) electrode structure connected to the long spin lifetime layer. The (first) electrode structure can be used for sinking currents (and/or power and/or signals) to and/or sourcing currents (and/or power and/or signals) from the long spin lifetime layer.

Additionally, the method 900 can further comprise forming a second electrode structure connected to the first ferromagnetic layer and forming a third electrode structure connected to the second ferromagnetic layer.

In the following, some examples are described. Example 1 is a spintronic device comprising a first ferromagnetic layer comprising a first direction of magnetic polarization, a second ferromagnetic layer comprising a second direction of magnetic polarization opposite to the first direction, a long spin lifetime layer, a first tunnel barrier layer disposed between the first ferromagnetic layer and the long spin lifetime layer, and a second tunnel barrier layer disposed between the second ferromagnetic layer and the long spin lifetime layer.

In example 2, the subject matter of example 1 can optionally include the first direction of magnetic polarization of the first ferromagnetic layer and the second direction of magnetic polarization of the second ferromagnetic layer being independent of external magnetic fields.

In example 3, the subject matter of example 1 or 2 can optionally include the first ferromagnetic layer being configured to spin polarize a first electric current passing through the first ferromagnetic layer in the first direction of magnetic polarization, and the second ferromagnetic layer being configured to spin polarize a second electric current passing through the second ferromagnetic layer in the second direction of magnetic polarization.

In example 4, the subject matter of example 3 can optionally include the directions of spin polarization being independent of the operating state of the spintronic device.

In example 5, the subject matter of one of the examples 1 to 4 can optionally further comprise an electrode structure coupled to the long spin lifetime layer.

In example 6, the subject matter of example 5 can optionally further comprise a second electrode structure coupled to the first ferromagnetic layer and a third electrode structure coupled to the second ferromagnetic layer.

In example 7, the subject matter of example 6 can optionally include a tunnel magnetoresistance between the second and the third electrode structure being larger than about 200%.

In example 8, the subject matter of example 6 or 7 can optionally include a resistance between the second and the third electrode structure being larger than about 1.8 kOhm.

In example 9, the subject matter of one of the examples 6 to 8 can optionally include a resistance between the first and the second electrode structure and a resistance between the first and the third electrode structure being each less than about 800 Ohm.

In example 10, the subject matter of one of the examples 6 to 9 can optionally include a resistance between the second and the third electrode structure being at least about 10 times larger than a resistance between the first and the second electrode structure or being at least about 10 times larger than a resistance between the first and the third electrode structure.

In example 11, the subject matter of one of the examples 1 to 10 can optionally include a maximal thickness of the long spin lifetime layer being less than about 2 times a maximal thickness of at least one of the first and the second tunnel barrier layer.

In example 12, the subject matter of one of the examples 1 to 11 can optionally include the long spin lifetime layer comprising less than about 30% spin coherence degradation of a spin polarized current flowing through the long spin lifetime layer.

In example 13, the subject matter of one of the examples 1 to 12 can optionally include the long spin lifetime layer comprising a material based on at least one of graphene, epitaxial graphene, carbon nanospheres, transition metal dichalcogenide monolayers, a superconductor, gallium-arsenide quantum well, body-centered cubic crystalline cobalt iron alloy, or methylammonium lead iodide.

In example 14, the subject matter of one of the examples 1 to 13 can optionally include the first and the second ferromagnetic layer comprising at least one of iron, nickel, cobalt, gadolinium, or any alloy thereof or any alloy thereof coupled with boron.

In example 15, the subject matter of one of the examples 1 to 14 can optionally include the first and the second tunnel barrier layer comprising at least one of magnesium oxide, aluminum oxide, aluminum nitride, titanium-alloyed aluminum oxide, titanium oxide, strontium titanium oxide, tantalum oxide, or zinc oxide.

Example 16 is a duplexer device comprising a spintronic device according to one of the examples 1 to 15, a transmit port connected to the first ferromagnetic layer of the spintronic device, a receive port connected to the second ferromagnetic layer of the spintronic device, and a transceive port connected to the long spin lifetime layer of the spintronic device.

In example 17, the subject matter of example 16 can optionally further comprise a first N-path filter coupled between the transmit port and the first ferromagnetic layer of the spintronic device, a second N-path filter coupled between the second ferromagnetic layer of the spintronic device and the receive port, and a compensation signal path coupled between the transmit port and the receive port.

In example 18, the subject matter of example 17 can optionally include the compensation signal path being connected in parallel to a series connection of the first N-path filter, the spintronic device, and the second N-path filter.

In example 19, the subject matter of example 17 or 18 can optionally include a phase response of the compensation signal path being out of phase relative to a phase response from the transmit port to the receive port via the first N-path filter, the spintronic device, and the second N-path filter.

In example 20, the subject matter of one of the examples 17 to 19 can optionally include a magnitude response of the compensation signal path corresponding to a magnitude response from the transmit port to the receive port via the first N-path filter, the spintronic device, and the second N-path filter.

In example 21, the subject matter of one of the examples 17 to 20 can optionally include the compensation signal path comprising at least one phase shifting element and an attenuation element.

In example 22, the subject matter of example 21 can optionally include the attenuation element being realized as a second spintronic device according to one of the examples 1 to 15.

In example 23, the subject matter of one of the examples 17 to 22 can optionally include the compensation signal path comprising a third N-path filter and a fourth N-path filter and a second spintronic device according to one of the examples 1 to 15, the third N-path filter being coupled between the transmit port and the first ferromagnetic layer of the second spintronic device, the fourth N-path filter being coupled between the second ferromagnetic layer of the second spintronic device and the receive port.

In example 24, the subject matter of example 23 can optionally include the first and the second N-path filter being configured to each apply a respective phase shift to a signal propagating from the transmit port to the receive port via the first N-path filter, the first spintronic device, and the second N-path filter, wherein the third and the fourth N-path filter being configured to each apply a respective phase shift to a signal propagating from the transmit port to the receive port via the third N-path filter, the second spintronic device, and the fourth N-path filter, and the sign of the respective phase shifts applied by the first and the second N-path filter being opposite to the sign of the respective phase shifts applied by the third and the fourth N-path filter.

In example 25, the subject matter of example 24 can optionally include the absolute values of the respective phase shifts applied by the first, second, third, and fourth N-path filter being each larger than about 40 degree and smaller than about 50 degree.

In example 26, the subject matter of one of the examples 23 to 25 can optionally include, for a signal propagating from the transmit port to the receive port, the first and the third N-path filter being configured to provide respective phase responses being equal in absolute value and opposite in sign with respect to each other, and the second and the fourth N-path filter being configured to provide respective phase responses being equal in absolute value and opposite in sign with respect to each other.

In example 27, the subject matter of one of the examples 17 to 26 can optionally include an N-path filter comprising at least one branch of two transistors connected in series, a phase shift of the N-path filter being controlled by a phase shift between respective periodic control voltages of the two transistors.

In example 28, the subject matter of one of the examples 17 to 27 can optionally include the duplexer device being an integrated circuit.

Example 29 is a transceiver device comprising a duplexer device of one of the examples 16 to 28, a transmit signal path connected to the transmit port of the duplexer device, and a receive signal path connected to the receive port of the duplexer device.

In example 30, the subject matter of example 29 can optionally include the transceiver device being configured to simultaneously provide a transmit signal and to receive a receive signal at the transceive port of the duplexer device, a frequency of the transmit signal being equal to a frequency of the receive signal.

Example 31 is a telecommunication device comprising the transceiver device according to example 29 or 30.

In example 32, the subject matter of example 31 can optionally further comprise an antenna connected to the transceive port of the duplexer device.

Example 33 is a method for forming a spintronic device, comprising forming a first ferromagnetic layer with a fixed first direction of magnetic polarization, forming a first tunnel barrier layer on the first ferromagnetic layer, forming a long spin lifetime layer on the first tunnel barrier layer, forming a second tunnel barrier layer on the long spin lifetime layer, and forming a second ferromagnetic layer with a fixed second direction of magnetic polarization on the second tunnel barrier layer, the first direction of magnetic polarization of the first ferromagnetic layer being opposite to the second direction of magnetic polarization of the second ferromagnetic layer.

In example 34, the subject matter of example 33 can optionally further comprise forming an electrode structure connected to the long spin lifetime layer.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A spintronic device comprising:
    a first ferromagnetic layer comprising a first direction of magnetic polarization;
    a second ferromagnetic layer comprising a second direction of magnetic polarization opposite to the first direction;
    a long spin lifetime layer;
    a first tunnel barrier layer disposed between the first ferromagnetic layer and the long spin lifetime layer; and
    a second tunnel barrier layer disposed between the second ferromagnetic layer and the long spin lifetime layer,
    wherein the first ferromagnetic layer is configured to spin polarize a first electric current passing through the first ferromagnetic layer in the first direction of magnetic polarization, and the second ferromagnetic layer is configured to spin polarize a second electric current passing through the second ferromagnetic layer in the second direction of magnetic polarization.

2. The spintronic device of claim 1, wherein the first direction of magnetic polarization of the first ferromagnetic layer and the second direction of magnetic polarization of the second ferromagnetic layer are independent of external magnetic fields.

3. The spintronic device of claim 1, further comprising an electrode structure coupled to the long spin lifetime layer.

4. The spintronic device of claim 3, further comprising a second electrode structure coupled to the first ferromagnetic layer and a third electrode structure coupled to the second ferromagnetic layer.

5. The spintronic device of claim 4, wherein a tunnel magnetoresistance between the second and the third electrode structure is larger than about 200%.

6. The spintronic device of claim 4, wherein a resistance between the first and the second electrode structure and a resistance between the first and the third electrode structure are each less than about 800 Ohm.

7. The spintronic device of claim 1, wherein a maximal thickness of the long spin lifetime layer is less than about 2 times a maximal thickness of at least one of the first and the second tunnel barrier layer.

8. The spintronic device of claim 1, wherein the long spin lifetime layer comprises less than about 30% spin coherence degradation of a spin polarized current flowing through the long spin lifetime layer.

9. A duplexer device, comprising:
    a spintronic device comprising
        a first ferromagnetic layer comprising a first direction of magnetic polarization,
        a second ferromagnetic layer comprising a second direction of magnetic polarization opposite to the first direction,
        a long spin lifetime layer,
        a first tunnel barrier layer disposed between the first ferromagnetic layer and the long spin lifetime layer, and
        a second tunnel barrier layer disposed between the second ferromagnetic layer and the long spin lifetime layer;
    a transmit port connected to the first ferromagnetic layer of the spintronic device;
    a receive port connected to the second ferromagnetic layer of the spintronic device; and a transceive port connected to the long spin lifetime layer of the spintronic device.

10. The duplexer device of claim 9, further comprising
a first N-path filter coupled between the transmit port and the first ferromagnetic layer of the spintronic device;
a second N-path filter coupled between the second ferromagnetic layer of the spintronic device and the receive port; and
a compensation signal path coupled between the transmit port and the receive port.

11. The duplexer device of claim 10, wherein a phase response of the compensation signal path is out of phase relative to a phase response from the transmit port to the receive port via the first N-path filter, the spintronic device, and the second N-path filter.

12. The duplexer device of claim 10, wherein a magnitude response of the compensation signal path corresponds to a magnitude response from the transmit port to the receive port via the first N-path filter, the spintronic device, and the second N-path filter.

13. The duplexer device of claim 10, wherein the compensation signal path comprises at least one phase shifting element and an attenuation element.

14. The duplexer device of claim 10, wherein the compensation signal path comprises a third N-path filter and a fourth N-path filter and a second spintronic device according to one of the claims 1 to 9, wherein the third N-path filter is coupled between the transmit port and the first ferromagnetic layer of the second spintronic device, wherein the fourth N-path filter is coupled between the second ferromagnetic layer of the second spintronic device and the receive port.

15. The duplexer device of claim 14, wherein the first and the second N-path filter are configured to each apply a respective phase shift to a signal propagating from the transmit port to the receive port via the first N-path filter, the first spintronic device, and the second N-path filter,
wherein the third and the fourth N-path filter are configured to each apply a respective phase shift to a signal propagating from the transmit port to the receive port via the third N-path filter, the second spintronic device, and the fourth N-path filter,
wherein the sign of the respective phase shifts applied by the first and the second N-path filter is opposite to the sign of the respective phase shifts applied by the third and the fourth N-path filter.

16. The duplexer device of claim 15, wherein the absolute values of the respective phase shifts applied by the first, second, third, and fourth N-path filter are each larger than about 40 degree and smaller than about 50 degree.

17. The duplexer device of claim 9, wherein the duplexer device is an integrated circuit.

18. A method for forming a spintronic device, the method comprising:
forming a first ferromagnetic layer with a fixed first direction of magnetic polarization;
forming a first tunnel barrier layer on the first ferromagnetic layer;
forming a long spin lifetime layer on the first tunnel barrier layer;
forming a second tunnel barrier layer on the long spin lifetime layer; and
forming a second ferromagnetic layer with a fixed second direction of magnetic polarization on the second tunnel barrier layer, wherein the first direction of magnetic polarization of the first ferromagnetic layer is opposite to the second direction of magnetic polarization of the second ferromagnetic layer,
wherein the first ferromagnetic layer is configured to spin polarize a first electric current passing through the first ferromagnetic layer in the first direction of magnetic polarization, and the second ferromagnetic layer is configured to spin polarize a second electric current passing through the second ferromagnetic layer in the second direction of magnetic polarization.

19. The method of claim 18, further comprising forming an electrode structure connected to the long spin lifetime layer.

* * * * *